United States Patent
Yamamoto et al.

(10) Patent No.: US 6,745,218 B1
(45) Date of Patent: Jun. 1, 2004

(54) ADAPTIVE DIGITAL FILTER

(75) Inventors: Akira Yamamoto, Osaka (JP); Hiroyuki Nakahira, Kyoto (JP); Hirokuni Fujiyama, Osaka (JP); Hiroki Mouri, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/527,404

(22) Filed: Mar. 16, 2000

(30) Foreign Application Priority Data

Mar. 16, 1999 (JP) .................................. 11-071069

(51) Int. Cl.$^7$ ............................................. G06F 17/10
(52) U.S. Cl. ...................................................... 708/322
(58) Field of Search ................................. 708/322, 319, 708/320, 314; 327/231, 552; 375/232, 229; 333/166

(56) References Cited

U.S. PATENT DOCUMENTS

| | | | | |
|---|---|---|---|---|
| 3,912,917 A | * | 10/1975 | Nussbaumer | 708/314 |
| 4,641,259 A | * | 2/1987 | Shan et al. | 708/322 |
| 4,779,225 A | * | 10/1988 | Fukasawa et al. | 327/231 |
| 4,791,390 A | * | 12/1988 | Harris et al. | 375/232 |
| 4,843,583 A | * | 6/1989 | White et al. | 708/319 |
| 4,947,363 A | * | 8/1990 | Williams | 327/552 |
| 5,014,232 A | * | 5/1991 | Andre | 708/322 |
| 5,142,552 A | * | 8/1992 | Tzeng et al. | 333/166 |
| 5,247,470 A | * | 9/1993 | McKown et al. | 708/320 |
| 5,260,896 A | * | 11/1993 | Iwasaki | 375/232 |
| 5,282,155 A | * | 1/1994 | Jones | 375/232 |
| 5,301,135 A | * | 4/1994 | Principe et al. | 708/320 |
| 5,303,173 A | * | 4/1994 | Mori et al. | 708/322 |
| 5,381,357 A | * | 1/1995 | Wedgwood et al. | 708/322 |
| 5,420,884 A | * | 5/1995 | Inoue | 708/322 |
| 5,528,627 A | * | 6/1996 | Yanagi et al. | 708/322 |
| 5,568,411 A | * | 10/1996 | Batruni | 708/322 |
| 5,657,349 A | * | 8/1997 | Sugiyama | 708/322 |
| 5,734,598 A | | 3/1998 | Abbott et al. | 360/39 |
| 5,781,063 A | * | 7/1998 | Kub et al. | 708/322 |
| 5,894,495 A | * | 4/1999 | Kase | 708/319 |
| 6,009,448 A | * | 12/1999 | Jong et al. | 375/229 |
| 6,209,014 B1 | * | 3/2001 | Prasad | 375/232 |

FOREIGN PATENT DOCUMENTS

| | | |
|---|---|---|
| JP | 64-084910 | 3/1989 |
| JP | 02-214322 | 8/1990 |
| JP | 03-117206 | 5/1991 |
| JP | 6-69759 | 3/1994 |
| JP | 8-87411 | 4/1996 |

OTHER PUBLICATIONS

Yen–Tai et al., Design and Implementation of an Adaptive FIR Filter Based on Delayed Error LMS Algorithm, IEEE Transactions on Computer Engineering, 1999, pp. 704–712.*

Copy of Japanese Office Action in corresponding parent case dated Feb. 14, 2001.

* cited by examiner

Primary Examiner—Chuong Dinh Ngo
Assistant Examiner—Chat Do
(74) Attorney, Agent, or Firm—Snell & Wilmer, LLP

(57) ABSTRACT

An adaptive digital filter of the present invention includes: a pipelined filtering section for performing a filtering operation based on input data and coefficient data so as to output filtered data; and a non-pipelined adaptation section for outputting the coefficient data to the pipelined filtering section by performing a coefficient adaptation operation in a non-pipelined process based on the input data and the filtered data so that the filtered data output from the pipelined filtering section converges to a predetermined reference value.

7 Claims, 14 Drawing Sheets

ADAPTIVE DIGITAL FILTER

BACKGROUND OF THE INVENTION

1. Field of the Invention

The present invention relates to an adaptive digital filter circuit for performing a coefficient adaptation operation by adaptively updating the filter coefficient.

2. Description of the Related Art

A digital filter is a filter for performing a predetermined operation on input signals (input data) which are discrete from each other along the time axis and along the amplitude axis so as to output signals (filtered data) which are also discrete along the time axls and along the amplitude axis.

Among various digital filters, those in which the parameter for the predetermined operation is not fixed but varies over time such that intended output signals are obtained are called "adaptive digital filters", and such an intended output signal is called a "reference signal".

For example, an adaptive digital filter may be used for waveform equalization performed in a read/write channel LSI which is used in HDD (hard disk drive). In recent years, there is a demand for increasing the data transmission rate of digital devices such as HDD. Accordingly, there is a demand for increasing the operation speed of an adaptive digital filter circuit for performing the adaptive digital filtering process. Moreover, as portable personal computers become widespread. there is also a demand for reducing the size and power consumption of an adaptive digital filter circuit.

An adaptive digital filter circuit can be functionally divided into a filtering circuit and an adaptation circuit. The filtering circuit is a circuit for performing an operation using predetermined input data $xi$ and coefficient data $ai$ so as to obtain filtered data $y'$ and filter output data $y$. The adaptation circuit is a circuit for performing a coefflcient adaptation operation, i.e., adaptively updating the coefficient data $ci$ so that the output of the filtering circuit, i.e., the filtered data $y'$, converges to an intended reference value $Y$.

The configuration and the operation of a conventional adaptive digital filter circuit will now be described with reference to the accompanying drawings.

FIG. 12 illustrates the configuration of the conventional adaptive digital filter circuit.

The adaptive digital filter circuit includes a pipelined filtering circuit 100 and a pipelined adaptation circuit 500. The pipelined filtering circuit 100 corresponds to the filtering circuit as described above. Specifically, the pipelined filtering circuit 100 performs an operation using the predetermined input data $xi$ and coefficient data $ci$ ($i$ is an integer satisfying $1 \leq i \leq n$) so as to obtain the filtered data $y'$, The pipelined adaptation circuit 500 corresponds to the adaptation circuit as described above. Specifically, the pipelined adaptation circuit 500 adaptively updates the coefflcient data $ci$ so that the output of the filtering circuit, i.e., the filtered data $y'$, converges to the intended reference value $Y$.

For each of the pipelined filtering circuit 100 and the pipelined adaptation circuit 500 of the conventional adaptive digital filter circuit, the entire operation process is performed in a pipelined process. This is because a pipelined process is most suitable for realizing the recent demand in the art, i.e., the increase in the operation speed of an adaptive digital filter circuit.

The term "pipelined process" as used herein refers to a process of successively receiving and processing a plurality of input signals to successively output the operation results, in which an input signal is received before outputting the operation result of a preceding input signal. Each input signal is processed through a plurality of stages provided in the circuit which are independent from one another, in which each stage processes the input signal and then passes the processed signal to the next stage.

The pipelined filtering circuit 100 receives the input data $xi$ ($i$ is an integer satisfying $1 \leq i \leq n$), the coefficient data $ci$ ($i$ is an integer satisfying $1 \leq i \leq n$) and a primary clock signal clk having a cyole of $T$. The pipelined filtering circuit 100 performs a predetermined operation using the received input data $xi$ and the coefficient data $cti$ so as to output the filtered data $y'$. The filtered data $y'$ is input to the pipelined adaptation circuit 500. The pipelined filtering circuit 100 performs a pipelined process based on the primary clock signal clk. FIG. 12 shows the filtered data $y'$ and the filter output data $y$ as the outputs of the pipelined filtering circuit 100. The relationship between the filtered data $y'$ and the filter output data $y$ is as follows. The filtered data $y'$ is the result of the predetermined operation as described above, and the filter output data $y$ is a signal obtained by latching the filtered data $y'$ in response to the primary clock signal clk so as to adjust its timing before it is output to a subsequent circuit, e.g., a Viterbi decoding signal circuit in a read/write channel (R/W ch) LSI. The filtered data $y'$ before the latching process is used as the input to the pipelined adaptation circuit 500 so that it is possible to omit latching processes using registers and to avoid an unnecessary delay, thereby reducing the number of stages of the entire adaptive digital filter circuit and increasing the speed of the coefficient data update process.

The pipelined adaptation circuit 500 receives the input data $xi$ ($i$ is an integer satisfying $1 \leq i \leq n$), the output from the pipelined filtering circuit 100, i.e., the filtered data $y'$, the primary clock signal clk, and the secondary clock signal clkc. The pipelined adaptation circuit 500 adaptively updates the coefficient data $ci$ so that the output of the pipelined filtering circuit 100, i.e., the filtered data $y'$, converges to the intended reference value $Y$. The pipelined adaptation circuit 500 performs a pipelined process based on the primary clock signal clk. In other words, in the pipelined filtering circuit 100 and in the pipelined adaptation circuit 500, data is passed from one stage to another in synchronization with the cycle of the primary clock signal clk. The pipelined adaptation circuit 500 uses the secondary clock signal clkc for latching the updated coeff icient data $ci$ to be output later in a register. As will be more fully discussed below, the secondary clock signal clkc used for latching the coefficient data $ci$ in a register is frequency-divided by the latency of the coefficient adaptation operation.

The operation of the adaptive digital filter circuit will now be described by describing each of the operation performed by the pipelined filtering circuit 100 and the operation performed by the pipelined adaptation circuit 500.

A commonly-employed adaptive digital filter circuit performs an operation based on an algorithm called "LMS (least mean square)".

For any natural number 1, the input data $xi$ ($i$ is an integer satisfying $1 \leq i \leq n$) has a relationship represented by Expression 1 below.

$$x1[0] = x2[T] = \ldots = xn[(n-1)T] \qquad \text{Expression 1}$$

Herein, $x2[T]$, for example, denotes input data $x2$ which is input at time $t=T$. $T$ denotes the cycle of the primary clock signal clk.

The pipelined filtering circuit 100 receives the coefficient data $ci$ ($i$ is an integer satisfying $1 \leq i \leq n$) which is output from the pipelined adaptation circuit 500. The initial value of the coefficient data ci at the beginning of an operation may be a coefficient value which has been previously stored in the pipelined filtering circuit 100 or a coefficient value which has been previously stored in the pipelined adaptation circuit 500 and output to the pipelined filtering circuit 100.

The pipelined filtering circuit 100 caloulates the filtered data y' according to Expression 2 below by using the input data xi and the coefficient data ci.

$$y' = \Sigma c_i \cdot x_i \qquad \text{Expression 2}$$

Upon receiving the filtered data y' which is obtained by the operation represented by Expression 2 above, the pipelined adaptation circuit 500 adaptively updates the coefficient data ci so that the value thereof converges to the intended reference value Y. The update of the coefficient data is performed by using the amount of coefficient change $\Delta c_i$ (i is an integer satisfying $1 \leq i \leq n$), which is obtained by an operation represented by Expression 3 below. The coefficient adaptation operation according to Expression 3 below is the algorithm called "LMS (least mean square)".

$$\Delta c_i = \mu \cdot \epsilon \cdot x_i \qquad \text{Expression 3}$$

Herein, the amount of coefficient change $\Delta c_i$ denotes the amount of change in the coefficient data ci, and $\mu$ denotes a convergence coefficient, which is a positive constant. The error $\epsilon$ denotes an errorbetween the intended reference value Y and the filtered data y' and can be represented by Expression 4 below.

$$\epsilon = Y - y' \qquad \text{Expression 4}$$

The updated coefficient data ci' can be obtained according to Expression 5 below by using the coefficient data ci and the amount of coefficient change $\Delta c_i$ which is obtained by the operation represented by Expression 3.

$$c_i' = c_i + \Delta c_i \qquad \text{Expression 5}$$

It is known in the art that the following relationship holds when the coefficient data ci is updated according to Expression 5.

$$\Delta(\epsilon^2)/\Delta c_i \leq 0 \qquad \text{Expression 6}$$

Thus, $\epsilon^2$ always decreases, and the filtered data y' approaches the intended reference value Y.

FIG. 13 illustrates the configuration of the pipelined adaptation circuit 500. The pipelined adaptation circuit 500 performs operations respectively represented by Expressions 3–5 above.

The top of FIG. 13 shows a time axis which represents the amount of time required from the point in time when the pipelined adaptation circuit 500 receives the input data xi to the point in time when the data reaches the respective elements. The time axis is scaled based on the cycle T of the primary clock signal clk. For example, where the input data xi is input at time t=0, the coefficient updated by the pipelined adaptation circuit 500 is latched by a register 522 in the last stage at time t=11T.

The pipelined adaptation circuit 500 performs the operations respectively represented by Expressions 3–5 by using the input data xi (i is an integer satisfying $1 \leq i \leq n$), the output from the pLpelined filtering circuit 100, i.e., the filtered data y', the intended reference value Y, and the coefficient data ci (i is an integer satisfying $1 \leq i \leq n$) which is held in the internal register 522. As described above, the pipelined adaptation circuit 500 adaptively updates the coefficient data ci so that the output of the pipelined filtering circuit 100, i.e., the filtered data y', converges to the intended reference value Y.

The pipelined adaptation circuit 500 includes a plurality of registers (e.g., 510, 512, 516) for latching data having the predetermined number of bits, a plurality of multipliers (e.g., 518) for multiplication of two or more data, a plurality of adders (e.g., 514) for addition of two or more data, and a plurality of clipping circuits (e.g., 520) for an overflow process. The number of registers is proportional to the number of taps (i.e., the number of input data xi) and to the number of pipeline stages. In the pipelined adaptation circuit 500 shown in FIG. 13, the number of taps is seven and the number of pipeline stages is eleven.

The registers (e.g., 510, 512, 516) of the pipelined adaptation circuit 500 latch data upon receiving a pulse of the primary clock signal clk. Specifically, each of the registers holds data which was input at the instance of low-to-high transition of the primary clock signal clk, and outputs the held value until the next low-to-high transition of the primary clock signal clk. Since the primary clock signal clk has a cycle of T. data having a predetermined number of bits (e.g., 6 bits) is latched at time t=kT (k is an integer satisfying $1 \leq k$). For example, the register 510 latches the input data xi at time t=T. in response to the pulse of the primary clock signal clk at time t=T. The register 512 latches the input data xi which has been latched by the register 510 at time t=T in response to the low-to-high transition of the pulse of the primary clock signal clk at time t=2T. In FIG. 13, each of the other elements indicated by the same symbol as the registers 510 and 512 is also a register having the same function.

The multiplier (e.g., 518) and the adder (e.g., 514) receive two or more data and perform multiplication and addition, respectively, of the received data, so as to output the results thereof.

The clipping circuit (e.g., 520) is used for an overflow process for the signal to be output before externally outputting the coefficient data ci which has been updated by the pipelined adaptation circuit 500.

Referring to FIG. 13, upon receiving the input data xi and the primary clock signal clk, the register 510 latches the value of the input data xi. The signal latched by the register 510 is then passed to and latched by the next register 512 in synchronization with the cycle of the primary clock signal clk. This operation is repeated until time t=6T. Since the pipelined adaptation circuit 500, which performs a pipelined process, successively receives new input data xi for every cycle T of the primary clock signal clk, two data latched in adjacent registers are data which have been input to the pipelined adaptation circuit 500 at 'adjacent' (i.e., slightly different) timings.

The pipelined adaptation circuit 500 needs to obtain the error $\epsilon$ according to Expression 4 before performing the operation of Expression 3. The operation of Expression 4 is performed by using the adder 514 at time t which satisfies 5T<t<6T. This is because there is a time shift (5T in this case) between the point in time when the input data xi is input and the point in time when the pipelined adaptation circuit 500 receives the filtered data y' (i.e., the output of the pipelined filtering circuit 100), which 1a required for the operation of Expression 4. This time shift occurs due to the amount of time required for the pipelined filtering circuit 100 to generate the filtered data y' from the input data xi, and is dependent on the number of stages of the pipelined filtering circuit 100. In this specification, this time shift is referred to as a "latency".

The error e obtained by the operation of Expression 4 is latched by the register 516 at time t=6T in response to the low-to-high transition of the primary clock signal clk at time t=6T. Using the latched error $\epsilon$, the $\epsilon$ xi part of the operation of Expression 3 is performed at time t which satisfies 6T<t<7T. The input data xi input at time t=0 is latched by a group of registers until the error $\epsilon$ is obtained by using the filtered data y' which is calculated from the same input data xi.

Then, the operation $\mu \cdot (\epsilon \cdot xi)$ of Expression 3 is performed at time t which satisfies 8T<t<9T. and the amount of coefficient change $\Delta ci$ is latched by a register at time t=9T. Finally, the operation of Expression 5 is performed at time t which satisfies 9T<t<10T by using the previously obtained coefficient data ci and the amount of coefficient change $\Delta ci$, and the result of the operation is subjected to an overflow process by the clipping circuit 520. The updated coefficient data ci', i.e., the value after the overflow process, is latched by a register in response to the low-to-high transition of the clock signal clkc at time t=11T, and then output as the coefficient data ci. The above-described operations are performed based on the primary clock signal clk and the secondary clock signal clkc.

FIG. 14 is a timing diagram illustrating the timings of the signals processed in the pipelined adaptation circuit 500.

The primary clock signal clk is a pulse signal having a cycle of T.

After the amount of time 5T from the reception of the input data xi, the filtered data y' is generated by the pipelined filtering circuit 100 and input to the pipelined adaptation circuit 500. Thus, 5T is the amount of time required for the pipelined filtering circuit 100 (FIG. 12) to generate the filtered data y' since the reception of the input data xi.

According to the timing of the coefficient data ai shown at the bottom row of the timing diagram, it is shown that the amount of time required for given coefficient data ci to be processed into new updated coefficient data ci is 11T.

A pipelined process essentially requires registers for storing the intermediate results of the process. In addition, the coefficient adaptation operation as described above requires a group of registers, as those shown in FIG. 13, in the pipelined adaptation circuit for matching the timing of the input data xi with that of the filtered data y'. Since the number of registers is proportional to the number of pipeline stages, an increase in the number of pipeline stages makes it necessary to increase the number of registers accordingly. Moreover, it is necessary to provide a number of registers according to the number of bit of each data. As a result, the number of registers included in the pipelined adaptation circuit 500 of FIG. 13 is 651.

Since most of these registers are used simultaneously in a pipelined process, the registers consume a substantial amount of power. Thus, the employment of a pipelined process to increase the process speed inevitably increases the number of registers. As a result, it is difficult to reduce the power consumption when employing a pipelined process.

Moreover, an increase in the number of pipeline stages increases the amount of time required from the reception of an input signal to th update of the coefficient, and also increases the amount of time required for a coefficient to converge from its initial value to a value such that an intended output value can be obtained.

If the frequency of the operation clock is increased in response to the recent demand in the art, i.e., the increase in the operation speed of a circuit, the number of times each register in the circuit is operated increases, thereby increasing the power consumption of the circuit. Then, the amount of heat generated in the circuit also increases, thereby making it difficult to further increase the integration density of the circuit and reduce the size of the circuit.

SUMMARY OF THE INVENTION

According to one aspect of this invention, an adaptive digital filter includes: a pipelined filtering section for performing a filtering operation based on input data and coefficient data so as to output filtered data; and a non-pipelined adaptation section for outputting the coefficient data to the pipelined filtering section by performing a coefficient adaptation operation in a non-pipelined process based on the input data and the filtered data so that the filtered data output from the pipelined filtering section converges to a predetermined reference value.

In one embodiment of the invention, the adaptive digital filter further comprises a secondary clock signal generation circuit for receiving a primary clock signal having a predetermined frequency, generating at least one secondary clock signal synchronized with the primary clock signal and having a frequency which is different from the predetermined frequency, and outputting the at least one secondary clock signal to the non-pipelined adaptation section. The pipelined filtering section operates according to the primary clock. sgnal. The non-pipelined adaptation section operates according to the at least one secondary clock signal.

In one embodiment of the invention, the at least one secondary clock signal includes: a first secondary clock signal for latching the input data; a second secondary clock signal for latching the filtered data; and a third secondary clock signal for latching a result of the coefficient adaptation operation.

In one embodiment of the invention, the pipelined process has a predetermined number of stages. A relationship between a phase of the first secondary clock signal and a phase of the second secondary clock signal is dependent on the number of stages. A relationship between the phase of the second secondary clock signal and a phase of the third secondary clock signal is dependent on an amount of time required for the coefficient adaptation operation.

In one embodiment of the invention, at least a part of the coefficient adaptation operation is performed during a period of time from a point in time when the input data is latched in response to the first secondary clock signal to a point in time when the filtered data is latched in response to the second secondary clock signal.

In one embodiment of the invention, the non-pipelined adaptation section includes: an error calculation section for calculating and outputting an error between the filtered data and the predetermined reference value; a latency compensation section for outputting delayed data obtained by delaying the input data by at least an amount of time which is determined based on the number of stages; and an adaptation operation section for performing the coefficient adaptation operation based on the delayed data and the error so as to output the coefficient data.

In one embodiment of the invention, the adaptive digital filter further includes a secondary clock signal generation circuit for receiving a primary clock signal having a predetermined frequency, generating at least one secondary clock signal synchronized with the primary clock signal and having a frequency which is different from the predetermined frequency, and outputting the at least one secondary clock signal to the non-pipelined adaptation section. The error calculation section includes a register for latching the filtered data in response to the secondary clock signal.

In one embodiment of the invention, the adaptive digital filter further includes a secondary clock signal generation circuit for receiving a primary clock signal having a predetermined frequency, generating at least one secondary clock signal synchronized with the primary clock signal and having a frequency which is different from the predetermined frequency, and outputting the at least one secondary clock signal to the non-pipelined adaptation section. The latency compensation section includes a register for latching the input data in response to the secondary clock signal.

In one embodiment of the invention, the adaptive digital filter further includes a secondary clock signal generation circuit for receiving a primary clock signal having a predetermined frequency, generating at least one secondary clock signal synchronized with the primary clock signal and having a frequency which is different from the predetermined frequency, and outputting the at least one secondary clock signal to the non-pipelined adaptation section. The adaptation operation section includes a register for latching in response to the secondary clock signal a result of the coefficient adaptation operation performed based on the delayed data and the error.

In one embodiment of the invention, the coefficient adaptation operation is implemented by a software program.

In one embodiment of the invention, the calculation of the error between the filtered data and the predetermined reference value is implemented by a software program.

In one embodiment of the invention, a phase and a cycle of the first secondary clock signal, a phase and a cycle of the second secondary clock signal, and a phase and a cycle of the third secondary clock signal can be set by a software program.

In one embodiment of the invention, the coefficient adaptation operation is implemented by a software program, and the software program executes an operation of waiting for an input of a pulse of the first secondary clock signal.

In one embodiment of the invention, the coefficient adaptation operation is implemented by a sof tware program, and the software program executes an operation of waiting for an input of a pulse of the second secondary clock signal.

In one embodiment of the invention, the coefficient adaptation operation is performed based on an LMS algorithm.

In one embodiment of the invention, the coefficient adaptation operation is performed based on an RLS algorithm.

Thus, the invention described herein makes possible the advantage of providing an adaptive digital filter circuit whose power consumption is reduced by reducing the number of registers and the frequency with which they are operated, and in which the amount of time required for a coefficient to converge is reduced by reducing the number of pipeline stages.

This and other advantages of the present invention will become apparent to those skilled in the art upon reading and understanding the following detailed description with reference to the accompanying figures.

DESCRIPTION OF THE PREFERRED EMBODIMENTS

Various embodiments of the present invention will now be described with reference to the accompanying drawings.

Embodiment 1

Figure 1:
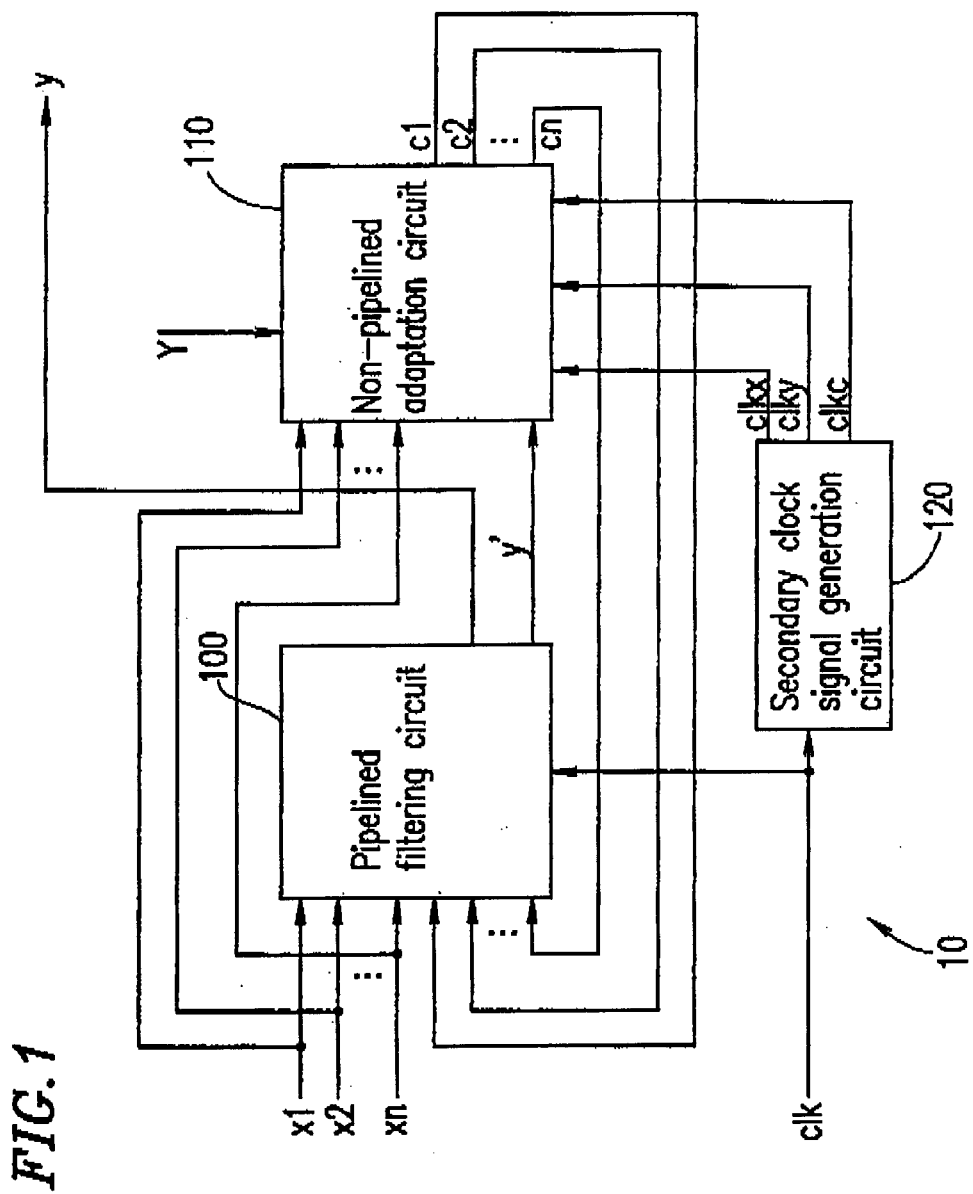
FIG. 1 is a diagram illustrating an adaptive digital filter circuit 10 of the present invention.

FIG. 1 illustrates an adaptive digital filter circuit 10 according to Embodiment 1 of the present invention.

The adaptive digital filter circuit 10 includes the pipelined filtering circuit 100, a non-pipelined adaptation circuit 110, and a secondary clock signal generation circuit 120.

The pipelined filtering circuit 100 performs an operation using the input data xi and the coefficient data ci so as to obtain the filtered data y'.

The secondary clock signal generation circuit 120 receives the primary clock signal clX having a cycle of T. The secondary clock signal generation circuit 120 frequency-divides the received primary clock signal clk so as to generate three secondary clock signals clkc, clkx and clky each having a cycle different from the cycle T of the primary clock signal clk.

The pipelined filtering circuit 100 receives the input data xi (i is an integer satisfying $1 \leq i \leq n$), the coeffloient data ci (i is an integer satlsfying $1 \leq i \leq n$), and the primary clock signal clk having a cycle of T.

Figure 2:
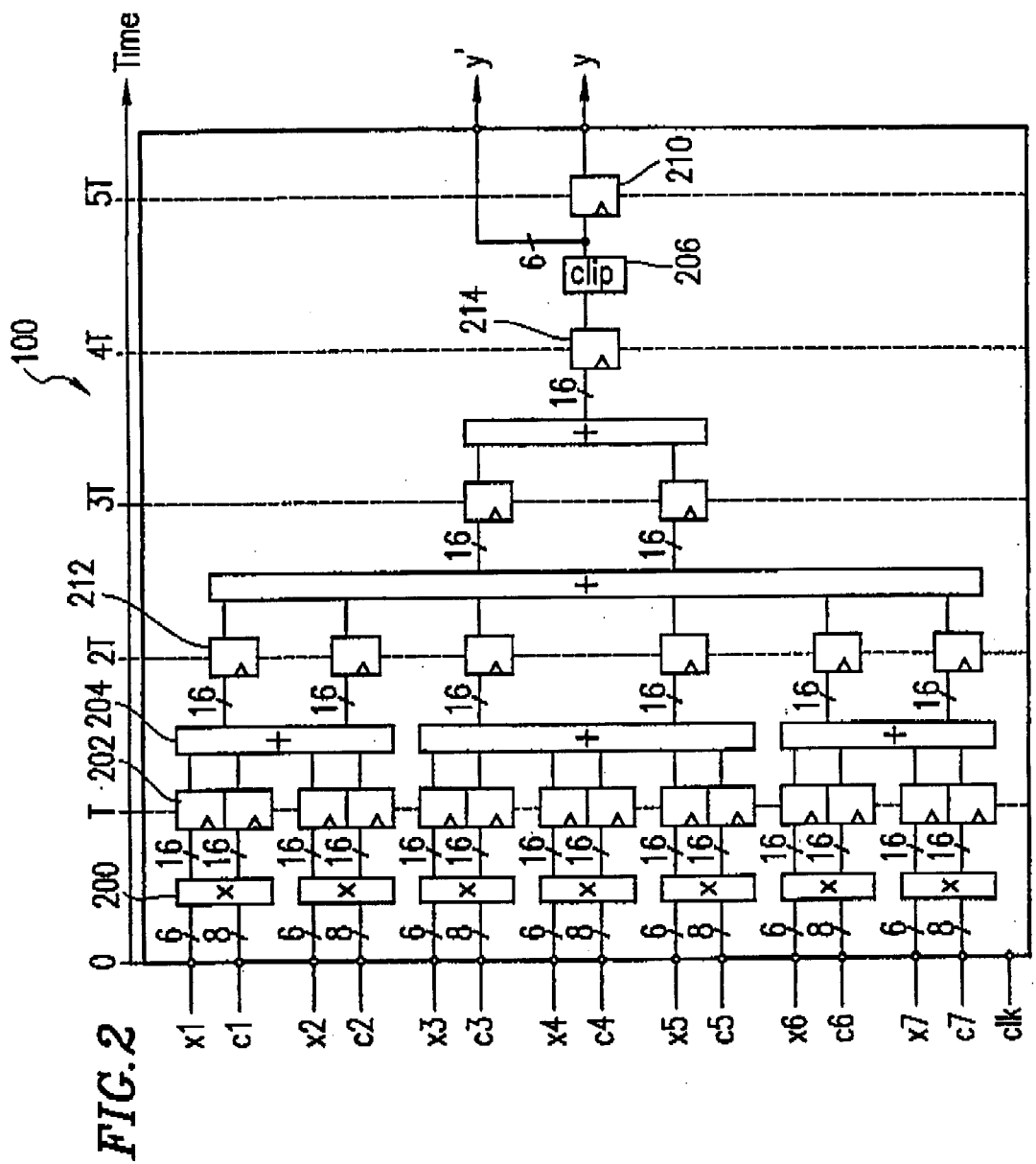
FIG. 2 is a diagram illustrating a configuration of a pipelined filtering circuit 100.

The pipelined filtering circuit 100 performs a predetermined operation using the received input data xi and the coefficient data ci so as to output the filtered data y' and the filter output data y. The filtered data y' is output to the non-pipelined adaptation circuit 110. The pipelined filtering circuit 100 performs a pipelined process based on the primary clock signal clk. The internal configuration of the pipelined filtering circuit 100 is illustrated in FIG. 2.

The non-pipelined adaptation circuit 110 adaptively updates the coefficient data ci so that the output of the filtering circuit, i.e., the filtered data y', converges to the intended reference value Y. The non-pipelined adaptation circuit 110 of the present invention performs operations without performing a pipelined process.

Figure 3:
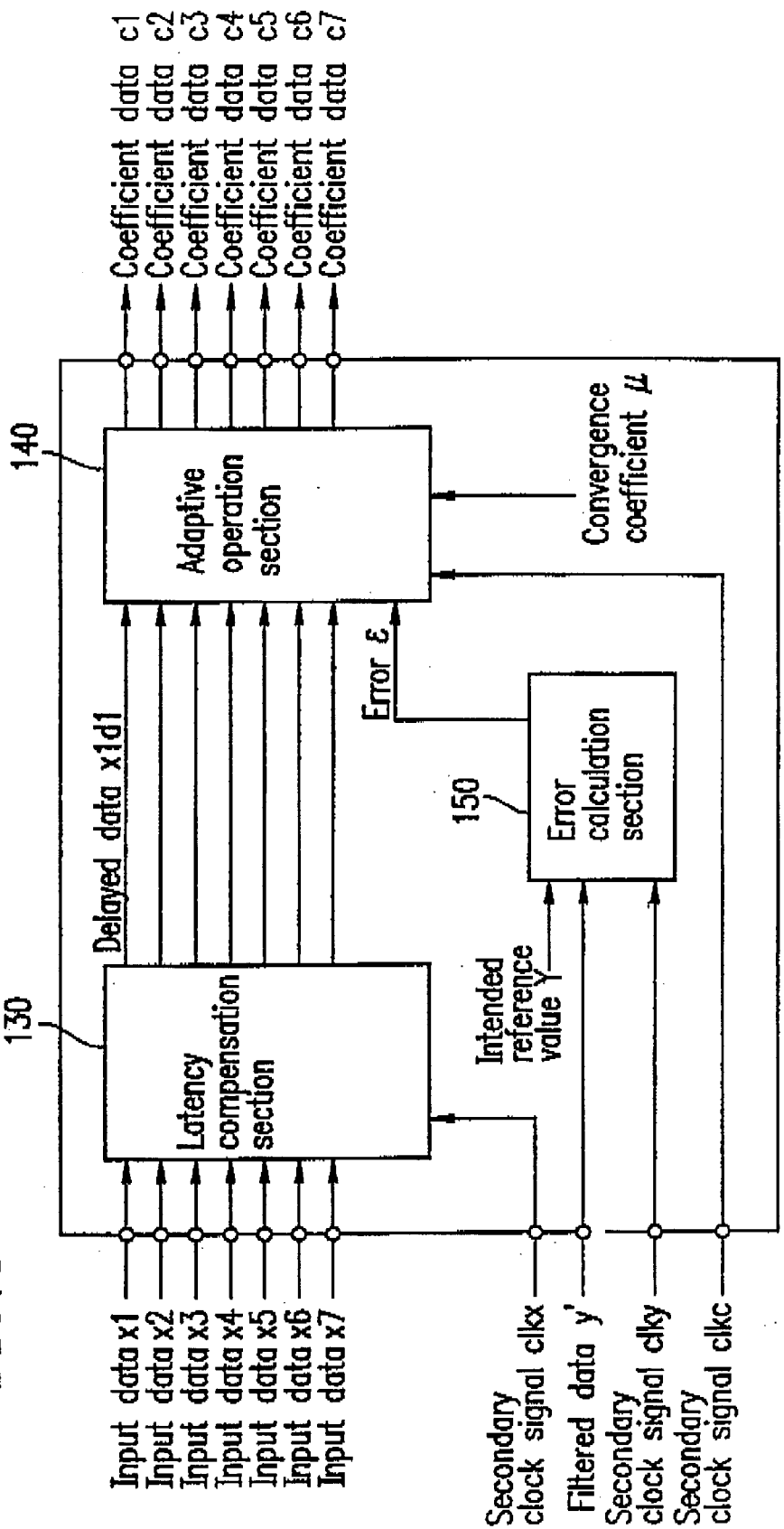
FIG. 3 is a diagram illustrating components of a non-pipelined adaptaton circuit 110.

FIG. 3 illustrates the configuration of the non-pipelined adaptation circuit 110. The non-pipelined adaptation circuit 110 includes a latency compensation section 130 for compensating for the time shift which occurs due to the amount of time required for the pipelined filtering circuit 100 (FIG. 1) to generate the filtered data y' from the input data xi, an error calculation section 150 for performing the operation of Expression 4 using an adder 304 to obtain the error $\epsilon$, and an adaptive operation section 140 for performing a coefficient adaptation operation based on the LMS algorithm.

The non-pipelined adaptation circuit 110 receives the input data xi, the filtered data y' output from the pipelined filtering circuit 100, and the secondary clock signals clkc, clkx and clky from the secondary clock signal generation circuit 120.

The non-pipelined adaptation circuit 110 adaptively updates the coefficient data ai so that the output of the pipelined filtering circuit 100, i.e., the filtered data y', converges to the intended reference value Y. The latency compensation section 130 outputs data xidi, a delayed version of the input data xi, so as to compensate for the time shift which occurs due to the amount of time required for the pipelined filtering circuit 100 (FIG. 1) to generate the filtereddata y' from the input data xi. The error calculation section 150 outputs the error $\epsilon$ based on the filtered data y' and the intended reference value Y. The adaptive operation section 140 performs a coefficient adaptation operation based on the delayed data xid1, the error $\epsilon$, and the convergence coefficient $\mu$, which is a constant, so as to output the coefficient data ci.

The latency compensation section 130 operates based on the secondary clock signal clkx, the error calculation section 150 operates based on the secondary clock signal clky, and the adaptive operation section 140 operates based on the secondary clock signals clkc. It is a feature of the present invention that the respective components of the non-pipelined adaptation circuit 110 operate based on different secondary clock signals, as described above. Each of these components processes data in a non-pipelined process.

Figure 4:
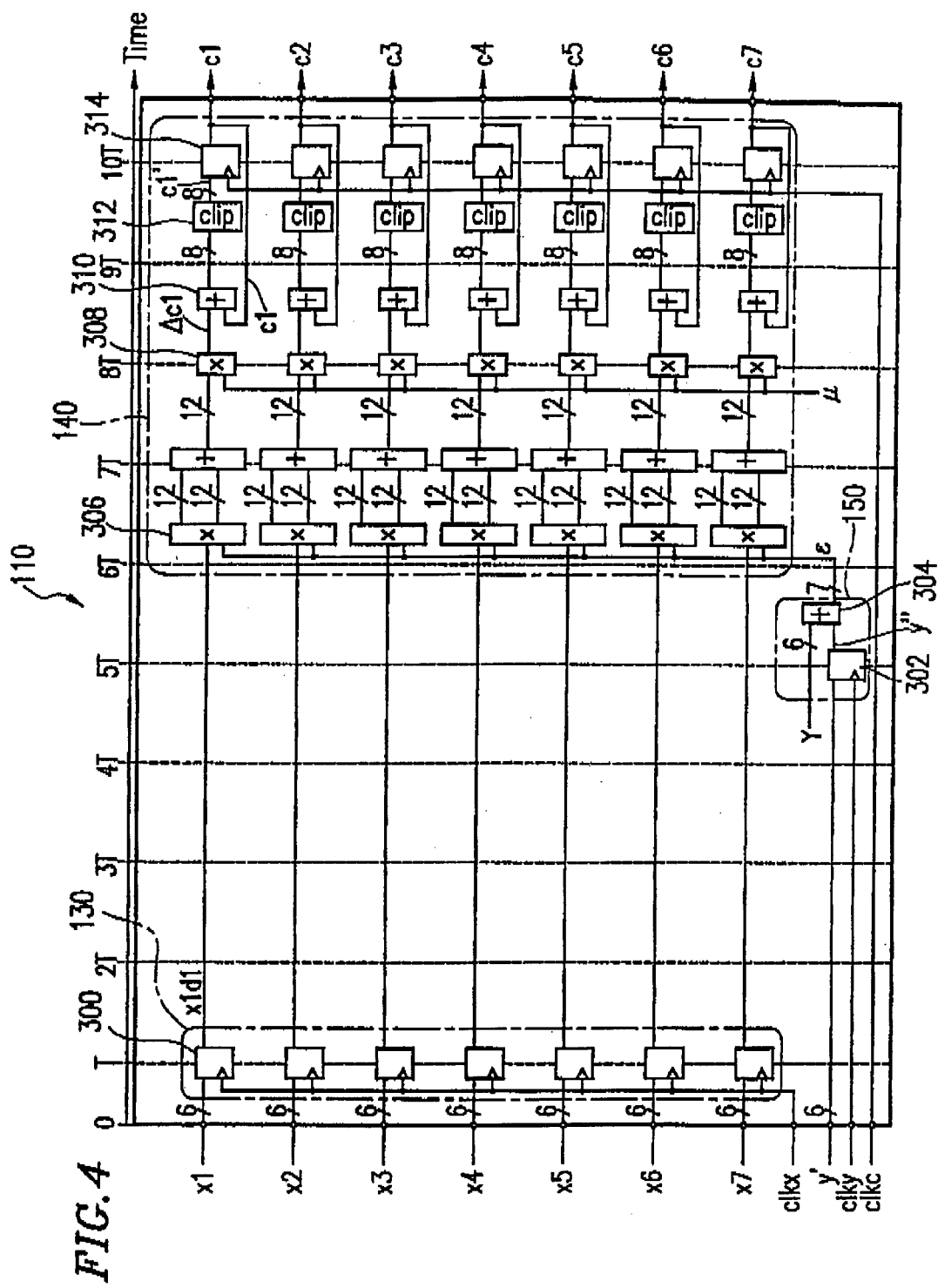
FIG. 4 is a diagram illustrating a configuration of each component of the non-pipelined adaptation circuit 110.

FIG. 4 illustrates the circuit configuration of the non-pipelined adaptation circuit 110, in which the latency compensation section 130, the adaptive operation section 140, and the error calculation section 150 are each indicated by a chain line box.

The secondary clock signals clkc, clkx and clky each have a cycle of 10T. This means that the coefficient data ci is updated for every cycle of 10T. The phase difference between the secondary clock signals clkx and clky is determined based on the number of clock cycles required from the point in time when the pipelined filtering circuit 100 receives the input data xi to the point in time when the pipelined filtering circuit 100 outputs the filtered data y'. In the present embodiment, the phase difference between the secondary clock signals clkx and clky is 4T. The phase difference between the secondary clock signals elky and cake is 5T, which corresponds to the number of clock cycles required to complete the coefficient adaptation operation, i.e., a sequence of operations represented by Expressions 3 and 4.

The secondary clock signal generation circuit 120 outputs all of the generated secondary clock signals clkc, clkx and clky to the non-pipelined adaptation circuit 110.

The operations performed by the pipelined filtering circuit 100 and the non-pipelined adaptation circuit 110 of the adaptive digital filter circuit 10 illustrated in FIG. 1 will now be described.

First, the oonf iguration and the operation of each of the pipelined filtering circuit 100 and the non-pipelLned adaptation circuit 110 will be described.

FIG. 2 illustrates the configuration of the pipelined filtering circuit 100. The pipelined filtering circuit 100 is a product sum operation circuit which implements a 7-tap transversal filter.

The top of FIG. 2 shows a time axis which represents the amount of time required from the point in time when the pipe lined filtering circuit 100 receives the input data xi to the point in time when the data reaches the respective elements or when the data is output from the respective elements. The time axis is scaled based on the cycle T of the primary clock signal clk. For example, the amount of time required from time t=0 when the input data xi and the coefficient data ci are input to the pipelined filtering circuit 100 to the point in time when the filter output data y is obtained (latched by a register) is 5T. This amount of time is referred to as a "latency". The arrangement of the elements shown in FIG. 2 is different from the actual physical arrangement thereof, and, it is intended to illustrate by FIG. 2 that signals are input, processed, output at the timings represented by the time axis. The same also applies to the time axes of FIGS. 4 and 6.

As described above, the pipelined filtering circuit 100 receives the input data xi (i is an integer satisfying $1 \leq i \leq n$) having the relationship. represented by Expression 1 above, and the updated coefficient data ci from the non-pipelined adaptation circuit 110, so as to perform the operation of Expression 2 as described above.

The pipelined filtering circuit 100 includes a plurality of multipliers (e.g., 200) for multiplication of two or more data, a plurality of registers (e.g., 202) for latching data having the predetermined number of bits, a plurality of adders (e.g., 204) for addition of two or more data, and a clipping circuit 206 for an overflow process.

The multiplier (e.g., 200) and the adder (e.g., 204) receive two or more data and perform multiplication and addition, respectively, of the received data, so as to output the results thereof.

The registers of the pipelined filtering circuit 100 latch data upon teceiving the primary clock signal clk. Since the primary clock signal clk has a cycle of T, data having a predetermined number of bits is latched at time t=kT (K is an integer satisfying $1 \leq k$). For example, the register 202 latches the input data xi at time t=T in response to the low-to-high transition of the primary clock signal clk at time t=T. In FIG. 2, each of the other elements Indicated by the same symbol as the registers 202 is also a register having the same function, i.e., a register which latches data having a predetermined number of bits at time t=kT (k is an integer satisfying $1 \leq k$).

The clipping circuit 206 is used for an overflow process for the signal to be output before externally outputting the result of the operation of Expression 2 performed by the pipelined filtering circuit 100, i.e., the filtered data y'.

The pipelined filtering circuit 100 is configured so that the output from each of the multiplier (e.g., 200), the adder (e.g., 204) and the clipping circuit 206 is once latched by a register (e.g., 202). Specifically, the pipelined filtering circuit 100 is configured so that the output from each of the multiplier (e.g., 200), the adder (e.g., 204) and the clipping circuit 206 is input to a register (e.g., 202) and then latched in response to the low-to-high transition of the primary clock signal clk. This is because the pipelined filtering circuit 100 performs a pipelined process, whereby a subsequent stage cannot receive an input while a preceding stage is processing data, and it is necessary to hold the data until the preceding stage completes the operation.

The operation of the pipelined filtering circuit 100 will now be described. The operations performed by the pipelined filtering circuit 100 are all based on the primary clock signal clk having a cycle of T. In the present embodiment, the number of pipeline stages is set to five. This means that where the input data xi and the coefficient data ci are input to the pipelined filtering circuit 100 at time t=0, the time when the result of the operation, i.e., the filtered data y', is output is t=5T. FIGS. 1 and 2 show the filtered data y' and the filter output data y as the outputs of the pipelined filtering circuit 100. The relationship between the filtered data y' and the filter output data y is as follows. The filtered data y' is the result of the pipelined operation, and the filter output data y is a signal obtained by latching the filtered data y' in a register 210 in the last stage (FIG. 2) in response to the primary clock signal clk so as to adjust its timing before it is output to a subsequent circuit, e.g., a Viterbi decoding signal circuit in a read/write channel (R/W ch) LSI. The filtered data y' before the latching process is output to the non-pipelined adaptation circuit 110 so that it is possible to omit latching processes using registers in the last stage and to avoid an unnecessary delay, thereby reducing the process time for the entire adaptive digital filter circuit and increasing the speed of the coefficient data update process.

The pipelined filtering circuit 100 receives a plurality of 6-bit input data xi (i is an integer satisfying $123 \leq i \leq 7$) and a plurality of 8-bit coefficient data ci (i is an integer satisfying $1 \leq i \leq 7$) (time t=0).

The received input data xi and the coefficient data ci are multiplied with each other by the multiplier 200 (0<t<T). Such a multiplication of two data having different numbers of bits may be implemented by a technique well known In the art, e.g., add 2 bits to the significant-bit side of 6-bit data to obtain 8-bit data. The multiplier 200 outputs the intermediate results of the multiplication, i.e., "sum" and "carry", each as 16-bit data, and inputs the intermediate results to the register 202 (0<t<T).

The register 202 latches the multiplication intermediate result data in response to the primary clock signal clk (t=T). The latched multiplication intermediate result data is input to the adder 204.

The adder 204 receives the respective multipllcation intermediate result data and adds the intermediate results together (T<t<2T). The data after the addition is output to and latched by a register 212 (t=2T). In the example shown in FIG. 2, there are three adders which perform an addition operation at time t satisfying T<t<2T. It is understood that if necessary, it is possible to vary the number of adders, and the number of registers in the next stage which may be determined according to the number of adders.

The register 212 inputs the latched data to an adder at time t=2T in response to the primary clock signal clk.

In amanner similar to that described above, the data is added together (2T<t<3T), latched (t=3T), added together again (3T<t<4T), and latched again (t4T). At time t=4T, the value of the data latched by a register 214 corresponds to the result of the operation of Expression 2 above. The resultant signal from the operation is subjected to an overflow process by the clipping circuit 206 (4T<t<5T). The data after the overflow process by the clipping circuit 206 is output as the filtered data y'. The data after the overflow process is also latched by the register 210 (t=T5), and output as the filter output data y.

It is understood from the above description that when the input data xi and the coeff icient data ci are input to the pipelined filtering circuit 100 at time t=0, the pipelined filtering circuit 100 performs the operation represented by Expression 2 so that the filtered data y' is output at time t=5T at the latest. The amount of time 5T is referred to as a "latency" of the pipelined filtering circuit 100.

Next, the configuration and the operation of the non-pipelined adaptation circuit 110 illustrated in FIG. 3 will be described.

The non-pipelined adaptation circuit 110 performs operations without performing a pipelined process. Therefore, it is possible to reduce the number of registers from that required for a pipelined process, thereby suppressing the power consumption. Moreover, by reducing the number of registers, it is possible to reduce the circuit scale, thereby suppressing the production cost.

It is also possible to configure the entire adaptive digital filter circuit to perform a non-pipelined process in order to further reduce the number of registers and the power consumption. However, where the adaptive digital filter circuit is required to have a high throughput, it is necessary to configure the filtering circuit to perform a pipelined process. Thus, the non-pipelined process should not be applied to the filtering circuit.

Where the adaptation circuit is configured to perform a non-pipelined process, it is necessary in the coefficient adaptation operation to match the timing of the input data xi and the output of the pipelined filtering circuit 100, i.e., the filtered data y'. In the present invention, this is achieved by employing secondary clock signals for latching the respective signals, as will be described later.

The non-pipelined adaptation circuit 110 of the present invention for performing the operations represented by Expressions 3–5 above is an LMS circuit which operates based on the LMS algorithm.

The non-pipelined adaptation circuit 110 performs the operations of Expressions 3–5 by using the input data xi (i is an integer satisfying $1 \leq i \leq 7$), the output from the pipelined filtering circuit 100, i.e., the filtered data y', the intended reference value Y, and the coefficient data ci held in an internal register. Moreover, the non-pipelined adaptation circuit 110 operates based on the three different secondary clock signals clkc, clkx and clky. The function of each secondary clock signal will be described later. The non-pipelined adaptation circuit 110 adaptively updates the coefficient data ci so that the output of the pipelined filtering circuit 100, i.e., the filtered data y', converges to the intended reference value Y.

The non-pipelined adaptation circuit 110 (FIG. 4) includes a plurality of registers (e.g., 300, 302, 314) for latching data having the predetermined number of bite, a plurality of multipliers (e.g., 306, 308) for multiplication of two or more data, a plurality of adders (e.g., 304, 310) for addition of two or more data, and a plurality of clipping circuits 312 for an overflow process.

The registers (e.g., 300, 302, 314), the multipliers 306 and 308, the adders 304 and 310, and the clipping circuits 312 are equivalent to the registers (e.g., 202, FIG. 2), the multipliers (e.g., 200, FIG. 2), the adders (e.g., 204. FIG. 2), and the clipping circuits (e.g., 206, FIG. 2) which are referred to in the description of the pipelined filtering circuit 100 above.

The operation of the latency compensation section 130, the adaptive operation section 140, and the error calculation section 150 in the non-pipelined adaptation circuit 110 will now be described with reference to FIG. 4.

The non-pipelined adaptation circuit 110 receives the input data xi (i is an integer satisfying $1 \leq i \leq 7$), and the filtered data y' output from the pipelined filtering circuit 100. The latency compensation section 130 latches the received input data xi in the register 300 in response to the secondary clock signal clkx.

The error calculation section 150 latches the received filtered data y' in the register 302 by the secondary clock signal clky. The timing of the input of the filtered data y' is delayed from that of the input data xi by the amount of time which is determined according to the amount of time required for a process performed in the pipelined filtering circuit 100. While the latency of the pipelined filtering circuit 100 is 5T, as described above, the filtered data y' is a signal which is input to the error calculation section 150 of the non-pipelined adaptation circuit 110 without being latched by the register 210 in the last stage (FIG. 2), as discussed above. Therefore, the phase of the secondary clock signal clky for latching the filtered data y' in a register is shifted from that of the secondary clock signal alkx by 4T. It is shown in FIG. 4 that the filtered data y' is input to the register 302 at time t=5T, The register 302 of the error calculation section 150 outputs to the adder 304 a signal y" which is obtained by latching the filtered data y'. The adder 304 performs the operation of Expression 4 (5T<t<6T) so as to obtain the error $\epsilon$.

When the error $\epsilon$, which is an output value of the error calculation section 150, 1s obtained, the adaptive operation section 140 performs the multiplication of the error $\epsilon$ and the delayed data xid1 ($\epsilon \cdot$xid1). This corresponds to calculating ($\epsilon \cdot$xi) of Expression 3. The multiplication of the error e and the delayed data xid1 is effected by inputting the error a and the delayed data xid1 to the multiplier 306. When the multiplication of the error $\epsilon$ and the delayed data xid1 ($\epsilon \cdot$xid1) is completed, the result is further multiplied by the convergence coefficient $\mu$, thereby completing the operation of Expression 3 and thus obtaining the amount of coefficient change $\Delta$ci. The multiplication of the product ($\epsilon \cdot$xid1) and the convergence coefficient $\mu$ is effected by inputting the product ($\epsilon \cdot$xid1) and the convergence coefficient $\mu$ to the multiplier 308. The output of the multiplier 308 and the previously obtained coefficient data ci are input to the adder 310 so as to perform the operation of Expression 5. The result of the operation is subjected to an overflow process by the clipping circuit 312, thereby obtaining the updated coefficient data ci'. The updated coefficient data ci' is latched by the register 314 in response to the low-to-high transition of the secondary clock signal clkc at time t=10T, and then output as the coefficient data ci.

As shown in the figure, the adaptive operation section 140 includes the registers 314, but does not include any other registers for latching data at other points in time, e.g., 6T, 7T, 8T and 9T. This means that the intermediate operations in the adaptive operation section 140, i.e., the sequence of operations from the operation by the multiplier 306 to the overflow process by the clipping circuit 312, are not synchronized with a clock signal.

Therefore, this means that although the operation by the multiplier 308, for example, is shown in the figure to be performed at time t=8T, the operation does not have to be performed exactly at time t=8T, but is actually performed around time t=8T. It is understood that in order to ensure a normal operation of the circuit, the overflow process by the clipping circuit 312 needs to be completed before time t=10T at the latest.

Figure 5:
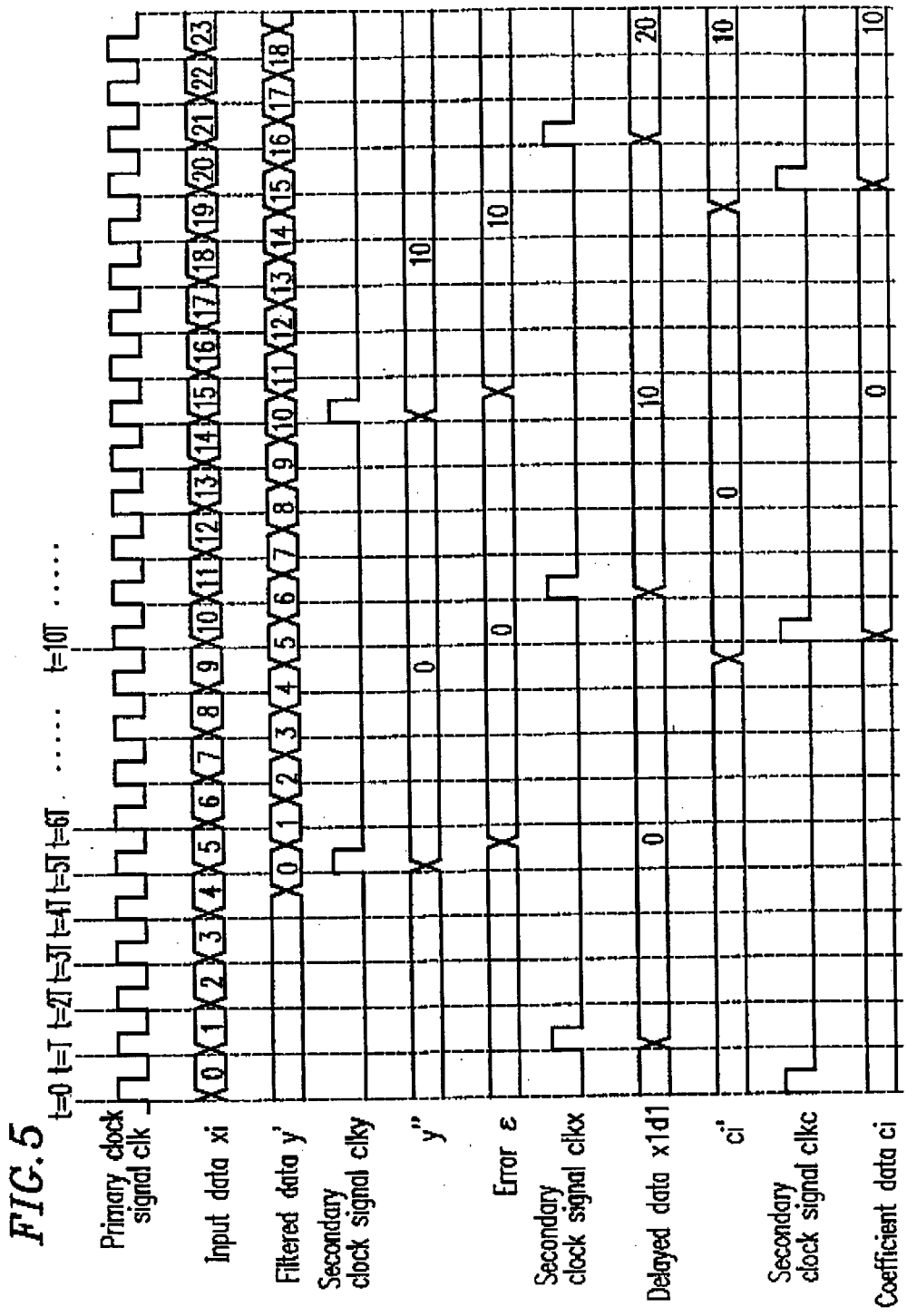
FIG. 5 is a timing diagram illustrating the timings of signals processed in the non-pipelined adaptation circuit 110.

FIG. 5 is a timing diagram illustrating the timings of the respective signals obtained in the non-pipelined adaptation circuit 110.

FIG. 5 will be discussed below. A plurality of input data xi are successively input in synchronization with the primary clock signal clk. In FIG. 5. each number provided in the signal of the Input data xl corresponds to "k" of time t=kT. The input data xi is latched in the register 300 (FIG. 4) at time t=T in response to the secondary clock signal clkx, upon which the delayed data xid1 is generated (only delayed data xid1 is shown in FIG. 5).

Then, the filtered data y' is input at time t satisfying 4T<t<5T, The time t is when the pipelined filtering circuit 100 (FIG. 2) completes the coefficient adaptation operation and the filtered data y' is output. The filtered data y' is latched In the register 302 (FIG. 4) at time t=5T in response to the secondary clock signal clky, upon which the signal y" is generated.

The operation $\epsilon$=Y-y" is performed at time t satisfying 5T,<t<6T by using the signal y" and the intended ref erence value Y. This corresponds to the operation of Expression 4. Thus, the error $\epsilon$ is obtained.

As a result of the operation of Expressions 3 and 5, the updated coefficient data ci' is obtained at time t satisfying 9T<t<10T. The obtained updated coefficient data ci' is latched in a register at time t=10T in response to the secondary clock signal clkc, and then output as the coefficient data ci.

Figure 13:
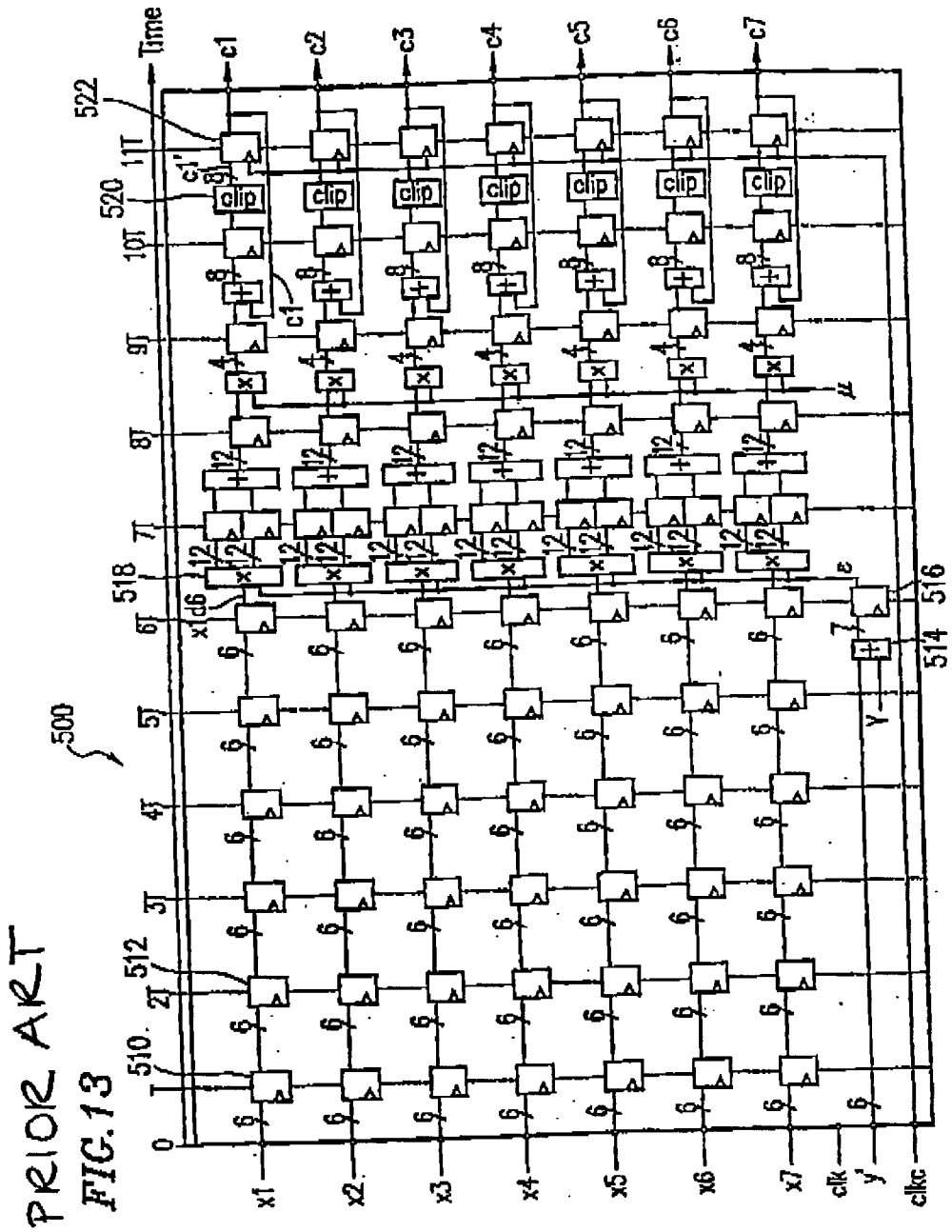
FIG. 13 illustrates a configuration of a conventional pipelined adaptation circuit 500.
Figure 14:
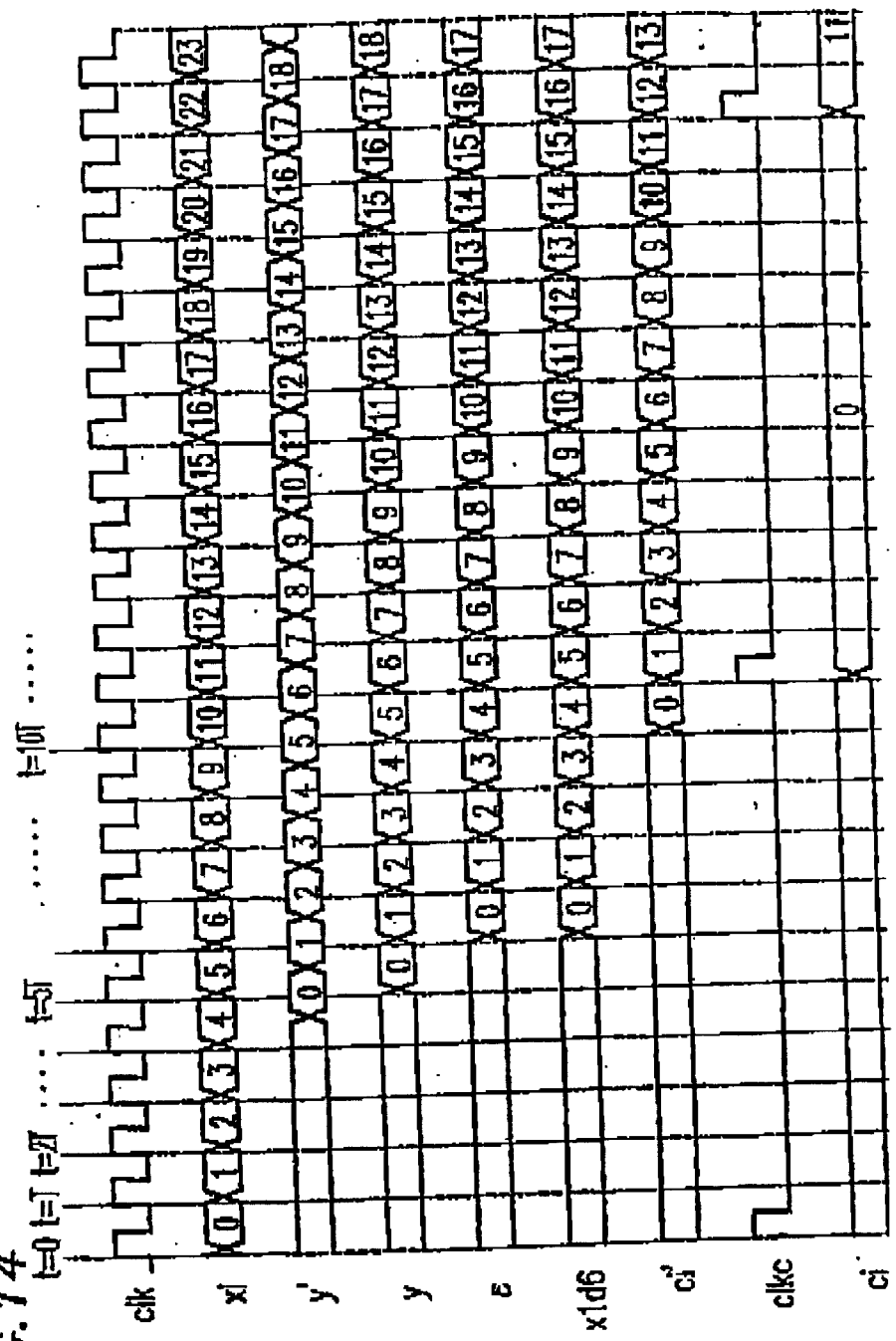
FIG. 14 is a timing diagram illustrating the timings of signals processed in the pipelined adaptation circuit 500.

The configuration of the non-pipelined adaptation circuit 110 such that it does not perform a pipelined process provides the following advantages over the conventional pipelined adaptation circuit 500 (FIG. 13).

First, the number of registers can be significantly reduced. specifically, the totalnumberof registers of the conventional pipelined adaptation circuit 500 is 651, as described above, whereas that of the non-pipelined adaptation circuit 110 according to Embodiment 1 is 104. The number 104 is obtained by adding together the number of the registers 300 each latching the 6-bit input data xi (i is an integer satisfying. $1 \leq i \leq 7$), the register 302 for latching the 6-bit filtered data y' from the pipelined f ltering circuit 100, and the number of registers 314 each receiving an 8-bit input for latching the updated coefficient data ci'.

By the significant reduction in the number of registers, it is possible to reduce the power consumption by the registers of the non-pipelined adaptation circuit 110.

Moreover, another comparison in terms of the frequency with which the registers are operated shows the following. Of the 651 registers provided in the conventional pipelined adaptation circuit 500, only the registers 522 (8 bits×7=56) which latch the result of the coefficient adaptation operation operate based on the secondary clock signal alke having a cycle of 11T, and the other 595 registers operate based on the primary clock signal clkhaving a cycle of T. Therefore, the total number of times the registers are operated for a period of time T is 595×1+56×(1/11)=600.1 [times].

In contrast, in the non-pipelined adaptation circuit 110 of the present embodiment. the registers 300, 302 and 314 operate based on the secondary clock signals clkx, caky and clkc. respectively, all having a cycle of 10T. Therefore, the total number of times the registers are operated for a period of time T is 104×(1/10)=10.4 [times].

Thus, it can be seen that the frequency with which the registers are operated is reduced by about 58-fold. Because of this, a significant reduction in the power consumption can be expected.

Moreover, according to the present invention, it is possible to reduce the amount of time from the reception of the input data xi to the completion of the coefficient update operation. The amount of time from the reception of the input data xi to the completion of the coefficient update operation is 11T for the conventional adaptation circuit illustrated in FIG. 10, and is 10T for the non-pipelined adaptation circuit 110 of the present invention. This reduction is achieved by the reduction in the number of registers provided for storing the intermediate results of the coefficient adaptation operation, thereby reducing the delay occurring due to the setup and hold time of the registers. Thus, the coefficient data ci can converge in a reduced amount of time, whereby it is possible to obtain an intended value as the filtered data in a reduced amount of time.

The adaptive digital filter circuit 10. the pipelined filtering circuit 100 and the non-pipelined adaptation circuit 110 are as described above.

Embodiment 2

Figure 6:
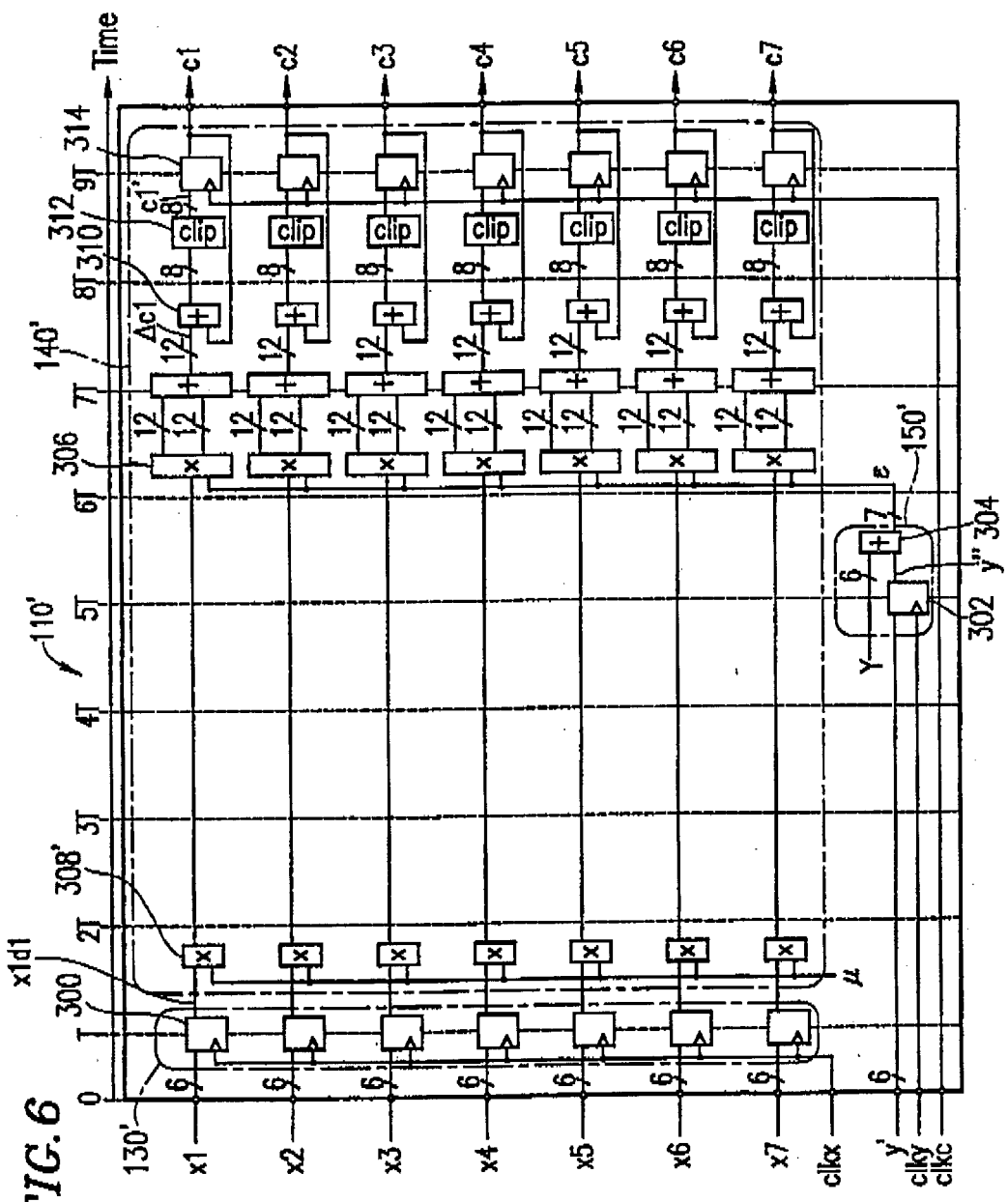
FIG. 6 illustrates a non-pipelined adaptation circuit 110' according to Embodiment 2 of the present invention: FIG.

In the present embodiment, another example of the non-pipelined adaptation circuit will be described. As compared to the non-pipelined adaptation circuit 110 (FIG. 4) describedin Embodiment 1 above, the timing when the part of the coefficient adaptation operation represented by Expression 3 is performed is different in a non-pipelined adaptation circuit 110' of the present embodiment (FIG. 6). More specifically, in the non-pipelined adaptation circuit 110 (FIG. 4) described in fr Embodiment 1, the multiplication with the convergence coefficient $\mu$ as represented by Expression 3 is performed by the multiplier 308 around time t=8T. Incontrast, in the non-pipelined adaptation circuit 110' of Embodiment 2 (FIG. 6), this operation is performed at a time t satisfying T<t<2T. Other than this, the configuration and the operation of the non-pipelined adaptation circuit 110' are the same as those of the non-pipelined adaptation circuit 110 of Embodiment 1 and will not further be described below.

FIG. 6 illustrates the non-pipelined adaptation circuit 110' according to Embodiment 2 of the present invention. The non-pipelined adaptation circuit 110' includes a latency compensation section 130', an adaptive operation section 140', and an error calculation section 150'.

As described in Embodiment 1 above, there is a time shift between the input data xi (i is an integer satisfying $123 \leq i \leq 7$ in Embodiment 2) received by the non-pipelined adaptation circuit 110' and the filtered data y' from the pipelined filtering circuit 100 (FIGS. 1 and 2). This is because an amount of time corresponding to the latency is required for the pipelined filtering circuit 100 (FIG. 2) to complete the filtering operation so as to output the filtered data y', as described above.

Therefore, a part of the coefficient adaptation operation (in this example, the $\mu \cdot xi$ part of the operation of Expression 3) which does not require the filtered data y' can be performed during this latency, i.e., the period of time between the point in time when the input data xi is latched and the point in time when the filtered data y' is latched. Thus, the latency can be used efficiently.

The period of time from the point in time when the input data xi is latched and the point in time when it is used for an operation corresponds to the phase difference between the secondary clock signal clkx and the secondary clock signal clky.

In the non-pipelined adaptation circuit 110', multipliers 308' are provided to receive the delayed data xid1 from the respective registers 300. The adaptive operation section 140' of the non-pipelined adaptation circuit 110' performs the multiplication $\mu \cdot xid1$ at time t satisfying T<t<2T. After performing the multiplication $\mu$. xid1, the adaptive operation section 140' receives the output value of the error calculation section 150', i.e., the error $\epsilon$, and performs a multiplication so as to obtain at time t=7T the amount of coefficient change $\Delta ci$, i.e., the amount of update of the coeff icient data ci. Eventually, the coefficient data ac can be obtained at t=9T.

In the non-pipelined adaptation circuit 110 of Embodiment 1 (FIG. 4). the coefficient data ci is obtained at time t=10T. Therefore, with the non-pipelined adaptation circuit 110' of the present embodiment, the coefficient data ci can be obtained at a time one cycle earlier than that with the non-pipelined adaptation circuit 110 of Embodiment 1 (FIG. 4).

As is clear from the description of Embodiment 1, it is understood that the secondary clock signals clkc, clkx and clky each have a cycle of 9T.

As described above, the amount of time required for the coefficient adaptation operation can be further reduced by performing the operations, which in Embodiment 1 had been performed after the filtered data y' is input, before the filtered data y' is input.

With the conventional adaptation circuit (FIG. 13), an operation needs to be completed within the amount of time T, i.e., the cycle of the primary clock signal clk, in any stage of the pipelined process. Therefore, the value of the convergence coefficient $\mu$ in limited to, 0.5, 0.25, 0.125, or the like, for which the operation can be performed only with simple bit shift operations.

However, with the non-pipelined adaptation circuit 110' of Embodiment 2, there is a certain amount of extra time corresponding to the latency of the pipelined filtering circuit 100, whereby an operation does not necessarily have to be completed within the amount of time T. Thus, the value of the convergence coefficient $\mu$ is not limited to a certain value, and the operation can be performed by using a more complicated variation of values of the convergence coefficient $\mu$. For example, the value of the convergence coefficient $\mu$ can be gradually decreased according to the elapsed time from the initial state. Thus, the amount of time required for the coefficient data ci to converge can be reduced by appropriately varying the value of the convergence coefficient $\mu$.

Embodiment 3

A feature of the present invention is that the coefficient adaptation operation is performed in a non-pipelined process. This feature can be implemented by software. In Embodiment 3, an adaptive digital filter circuit in which the coefficient adaptation operation of the non-pipelined adaptation circuit is performed by a CPU using software will be described.

Figure 7:
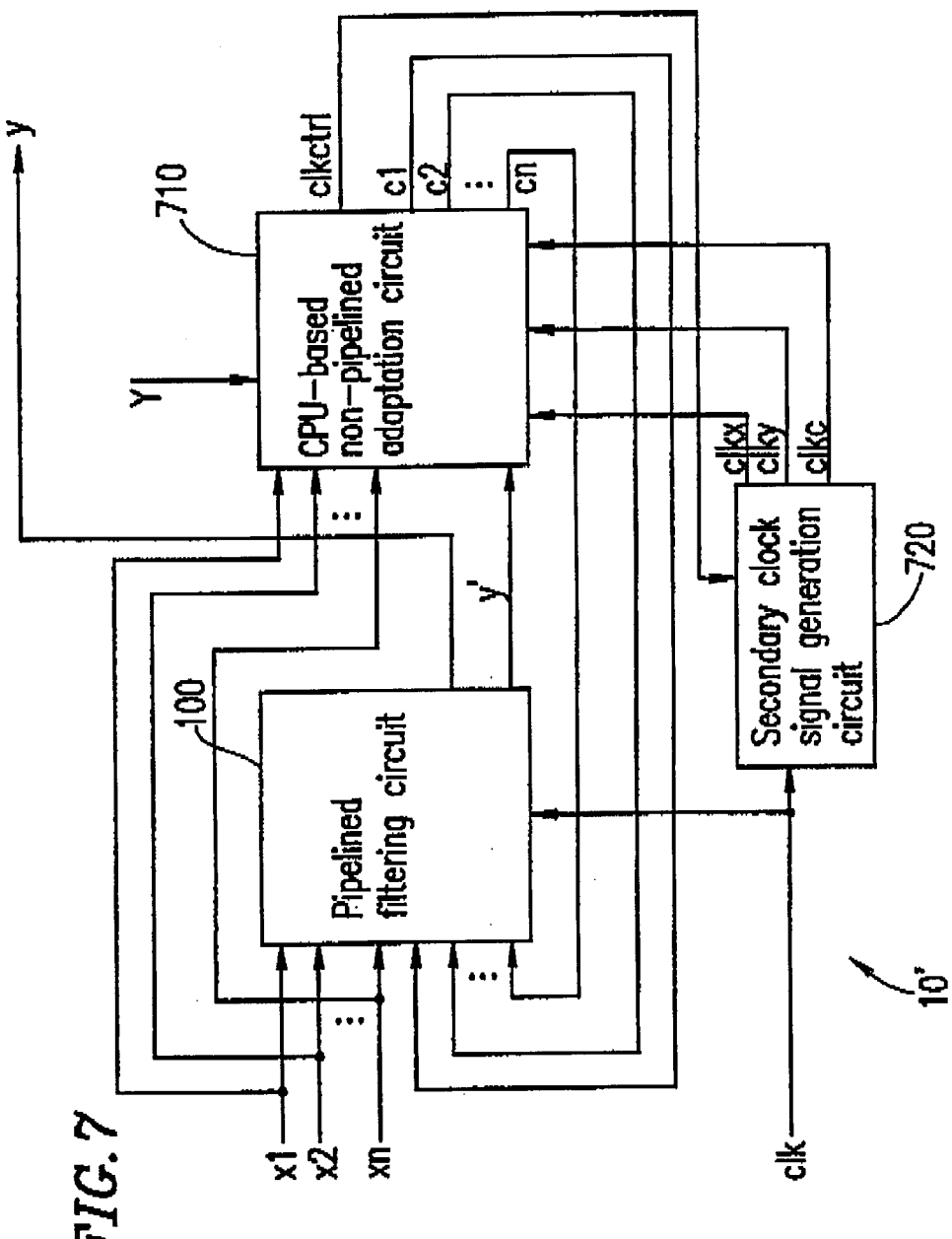
FIG. 7 illustrates an adaptive digital filter circuit 10' according to Embodiment 3 of the present invention.

FIG. 7 illustrates the configuration of an adaptive digital filter circuit 10' as an example of such an adaptive digital filter circuit.

Figure 8:
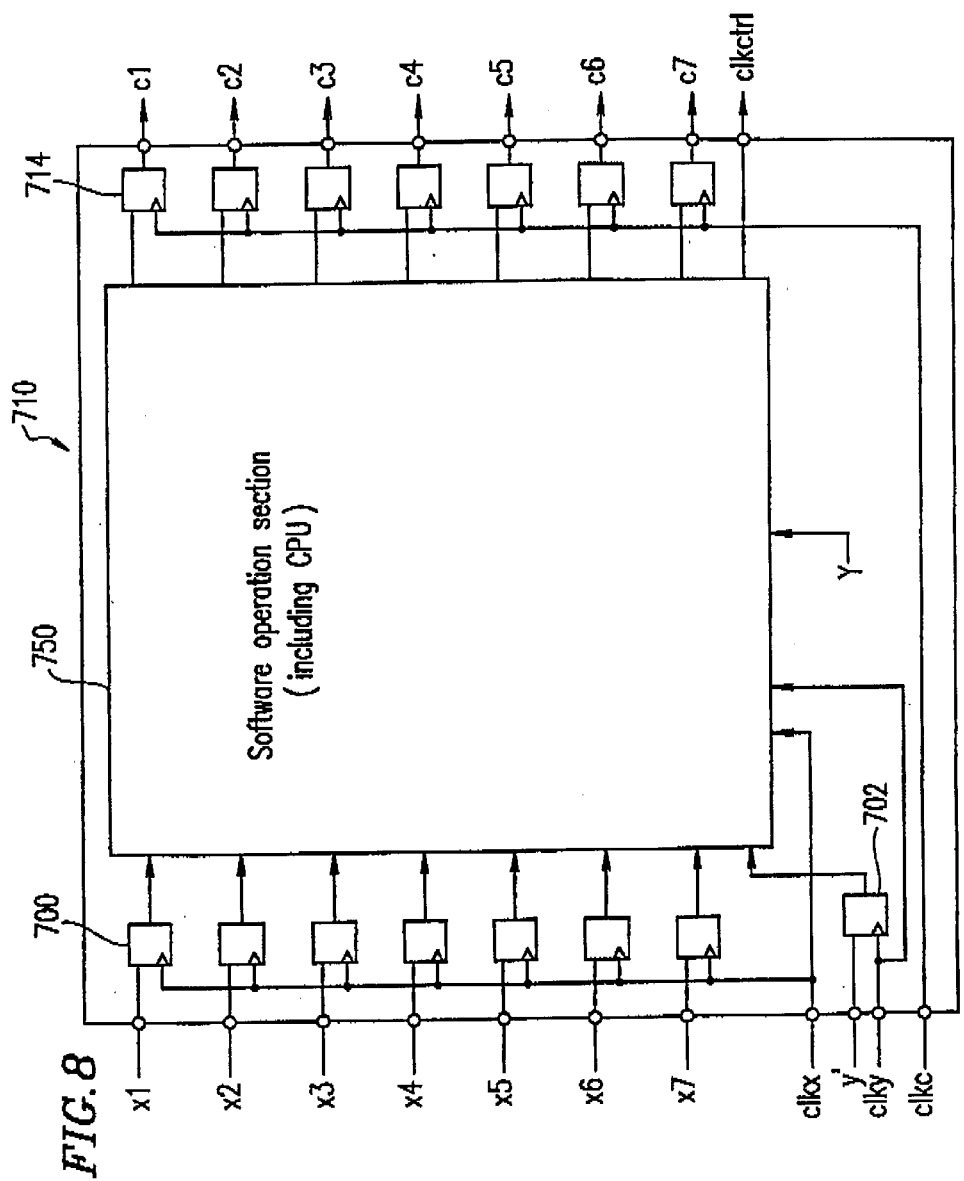
FIG. 8 illustrates a non-pipelined adaptation circuit 710 according to Embodiment 3 of the present invention.

FIG. 8 illustrates the configuration of a CPU-based non-pipelined adaptation circuit 710. A software operation section 750 illustrated in FIG. 8 includes. though not shown in the figure, a CPU, i.e., a central processing unit, as well as storage sections used for data inputs, outputs and operations and storage sections used for storing a software program. The configuration of these storage sections such that the CPU can input/output data according to the programmed procedure is well known in the art. A clock signal based on which the CPU operates is also not shown in the figure, and may be the same clock signal as the primary clock signal clk for the pipelined filtering circuit or a different clock signal. The secondary clock signals clkc, clkx and caky will not be described below because the function thereof is the same as that of Embodiment 1 described above.

The software operation section 750 needs to receive the secondary clock signals clkx and clky in order to match the timing of the data input/output as will be described below.

Figure 9:
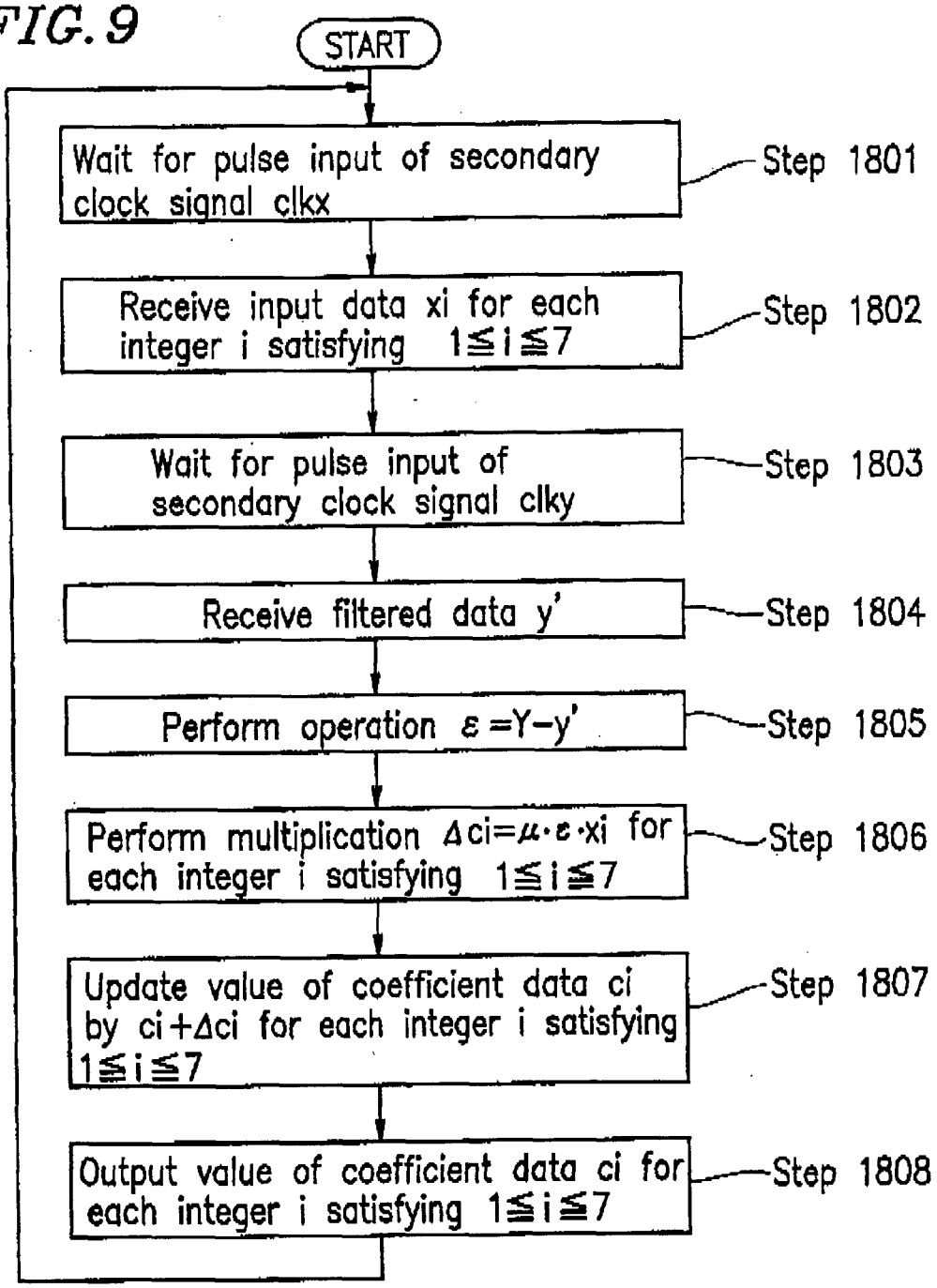
FIG. 9 illustrates an operation procedure of the non-pipelined adaptation circuit 710 according to Embodiment 3 of the present invention.

FIG. 9 illustrates an algorithm based on which the software operation section 750 operates. During the operation of the adaptive digital filter circuit, the software operation section 750 performs the procedure shown in FIG. 9 in a loop process. Each step of the procedure will now be described. The order in which these steps are performed is not limited to that described below.

In step 1801, the software operation section 750 waits for an input of a pulse of the secondary clock signal clkx. Specifically, the execution of the program is suspended until the low-to-high transition of the secondary clock signal clkx is detected. When the low-to-high transition of the secondary clock signal clkx is detected, the process proceeds to step 1802.

In step 1802, the input data xi is received for each integer i satisfying $1 \leq i \leq 7$.

In step 1803, the software operation section 750 waits for an input of a pulse of the secondary clock signal clky. Specifically, the execution of the program is suspended until the low-to-high transition of the secondary clock signal clky is detected. When the low-to-high transition of the secondary clock signal clky is detected, the process proceeds to step 1804. This means that the process waits for the pipelined filtering circuit 100 illustrated in FIG. 7 to complete the filtering operation and to output the filtered data y'.

In step 1804, the filtered data y' is received. This is done by receiving the value latched in a register 702.

In step 1805, the operation $$\epsilon = Y - y'$$

is performed. This corresponds to performing the calculation of Expression 4 so as to obtain the value of the error $\epsilon$. The intended reference value Y may be either stored in a storage section of the software operation section 750 as a sequence according to the time series of the intended reference value, or externally provided from the outside of the software operation sectlon 750. When the intended reference value Y is externally provided from the outside of the software operation section 750, the intended reference value Y is received before starting the operation of $\epsilon = Y - y'$.

step 1806, the multiplication $$\Delta ci = \mu \cdot \epsilon \cdot xi$$

is performed for each integer i satisfying $1 \leq i \leq 7$. This corresponds to performing the calculation of Expression 3 so as to obtain the value of the amount of coefficient change $\Delta ci$.

In step 1807, the value of the coefficient data ci is updated from that of the previous loop by ci+$\Delta$ci for each integer i satisfying $1 \leq i \leq 7$.

In step 1808, the value of the updated coefficient data ci is output for each integer i satisfying $1 \leq i \leq 7$.

After execution of step 1808, the process returns to step 1801 for repeating the process.

The secondary clock signals clkx, clky and clkc input to the CPU-based non-pipelined adaptation circuit 710 (FIG. 8) generally have a common cycle. In order for the CPU-based non-pipelined adaptation circuit 710 to properly operate, there is an operation time constraint in that the above-deseribed operations of steps 1801–1808 need to be performed during this cycle. Moreover, step 1802 needs to be completed before the secondary clock signal clky is input. Furthermore, the output operation of step 1808 needs to be completed before the secondary clock signal clkc is input to registers 714 (FIG. 8).

When the coefficient adaptation operation is performed by a CPU, the. algorithm for the coefficient adaptation operation can easily be changed. For example, while an embodiment using the LMS algorithm has been described in Embodiment 3. an embodiment using an RLS (recursive least square) algorithm may also be implemented only by changing the software program without changing the circuit configuration. When the algorithm for the coefficient adaptation operation is changed, the amount of time required for the coefficient adaptation operation also changes because the amount of calculation depends on the algorithm. Therefore, when changing the algorithm for the coefficient adaptation operation, the phase and the cycle of the secondary clock signals clkx, clky and clkc need to be changed so as to satisfy the above-mentioned constraint operation time. Therefore, the CPU-based non-pipelined adaptation circuit 710 has a function of outputting a clock control signal clkctrl to a secondary olock signal generation circuit 720, as illustrated in FIG. 7. After receiving the clock control signal alkatrl, the secondary clock signal generation circuit 720 changes the phase and the cycle of the secondary clock signals clkx, clky and clkc based on the clock control signal clkctrl. This operation needs to be performed only when changing the algorithm, but does not need to be performed during normal operation of the adaptive digital filter circuit, i.e., while performing the loop process shown in FIG. 9.

Embodiment 4

In the present embodiment, a PR (partial response) equalizer 800 including the pipelined filtering circuit 100 and the non-pipelined adaptation circuit 110 described in Embodiment 1.

Figure 10:
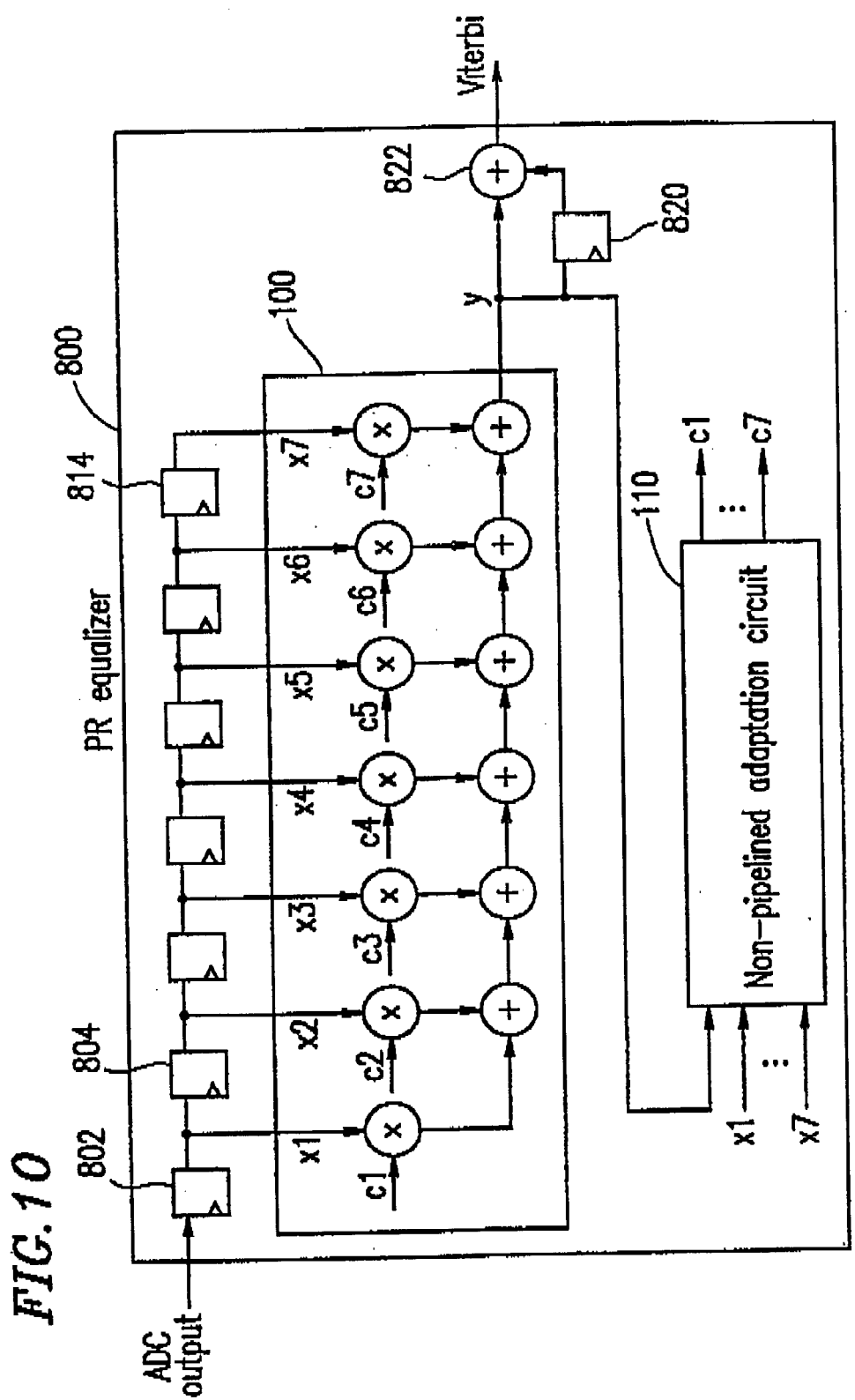
FIG. 10 illustrates a PR equalizer 800 according to Embodiment 4 of the present invention.

The PR equalizer 800 is a device for maintaining data with a narrow bandwidth by providing interference to the detected waveform (input waveform) at regular intervals, FIG. 10 illustrates the PR equalizer 800 of the present embodiment.

The PR equalizer 800 includes a plurality of registers 802, 804, ..., 814, and 820, the pipelined filtering circuit 100 of Embodiment 1, the non-pipelined adaptation circuit 110 of Embodiment 1, and an adder 822. Since the PR equalizer 800 uses the pipelined filtering circuit 100 and the non-pipelined adaptation circuit 110 of Embodiment 1, the PR equalizer 800 includes the secondary clock signal generation circuit 120 (not shown in FIG. 10; see FIG. 1). Alternatively, the PR equalizer 800 may be externally provided with the primary olock signal clk and the secondary clock signals clkc, clkx and clky (FIG. 1) for driving the pipelined filtering circuit 100 and the non-pipalined adaptation, circuit 110. The primary clock signal clk has a cycle of T.

The PR equalizer 800 receives as its input a signal output from an analog-digital converter (ADC), and latches the received signal in the register 802. The latched data is passed to, and latched in, the subsequent registers 504, ..., 814, sequentially. Where the input data latched in the register 802 is designated x1, the input data latched in the register 804 is designated x2, and so on, the input data x1–x7 satisfy Expression 1. The input data x1–x7 are further input to the non-pipelined adaptation circuit 110.

The pipelined filtering circuit 100 receives the input data x1–x7, and performs a pipelined filtering operation, so as to output the filter output data y to the non-pipelined adaptation circuit 110 and to the adder 822. The filter output data y is also latched in the register 820, from which it is output to the adder 822 after passage of a predetermined amount of time. The pipelined filtering circuit 100 receives the updated coefficient data from the non-pipelined adaptation circuit 110.

The non-pipelined adaptation circuit 110 receives the input data x1–x7 and the filter output data y from the pipelined filtering circuit 100 so as to output the coefficient data ci.

The conf iguration and the operation of the pipelined filtering circuit 100 and the non-pipelined adaptation circuit 110 are the same as those of Embodiment 1 and will not further be described below. The adder 822 receives the filter output data y output from the pipelined filtering circuit 109 and the latched signal output fromn the registar 820. The received signals are added together and the sum is output to an external Viterbi decoding circuit.

The PR equalizer 800 including the adaptive digital filter circuit 10 (FIG. 1) of the present invention can suitably be incorporated in a readlwrite channel LSI of a hard disk drive.

Figure 11:
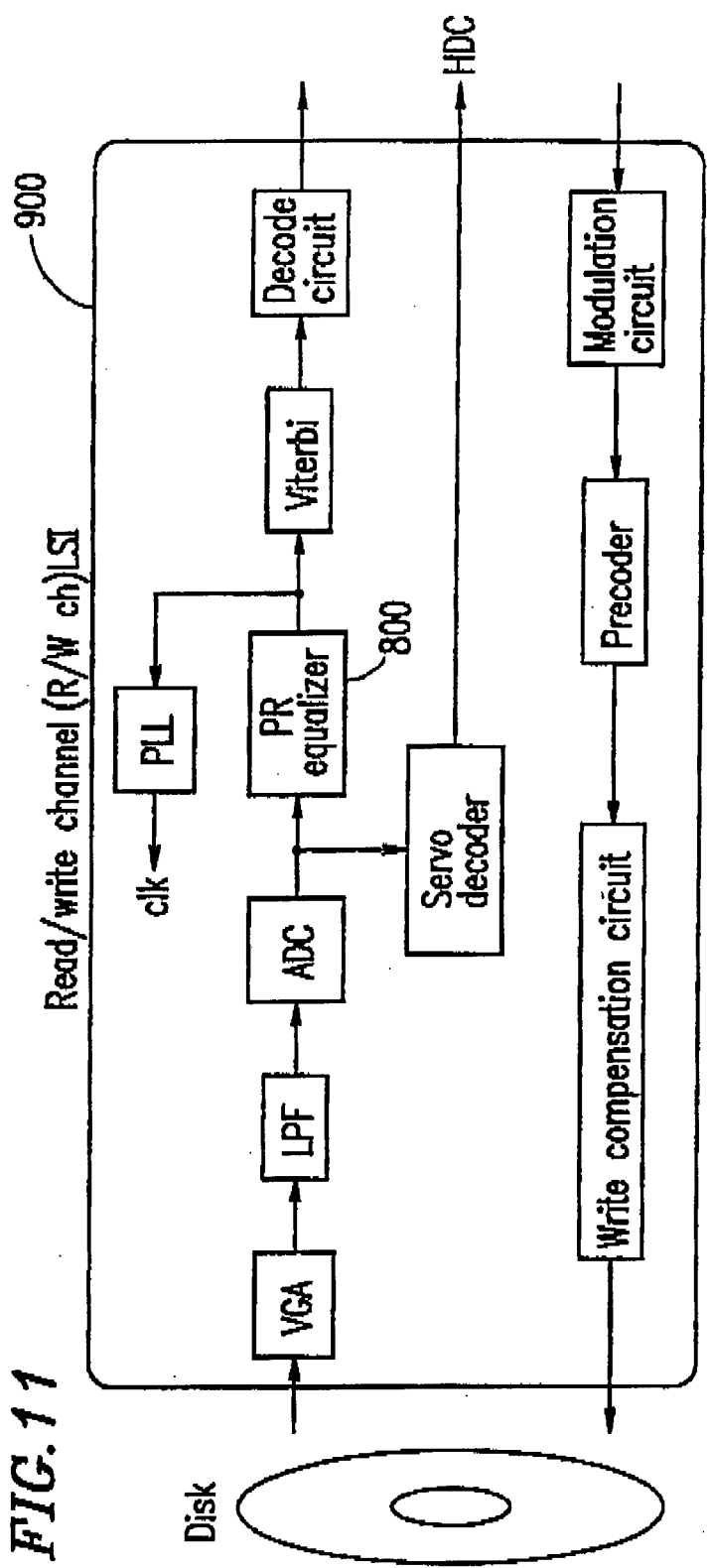
FIG. 11 illustrates a read/write channel LSI 900 of a hard disk drive using the PR equalizer 800.
Figure 12:
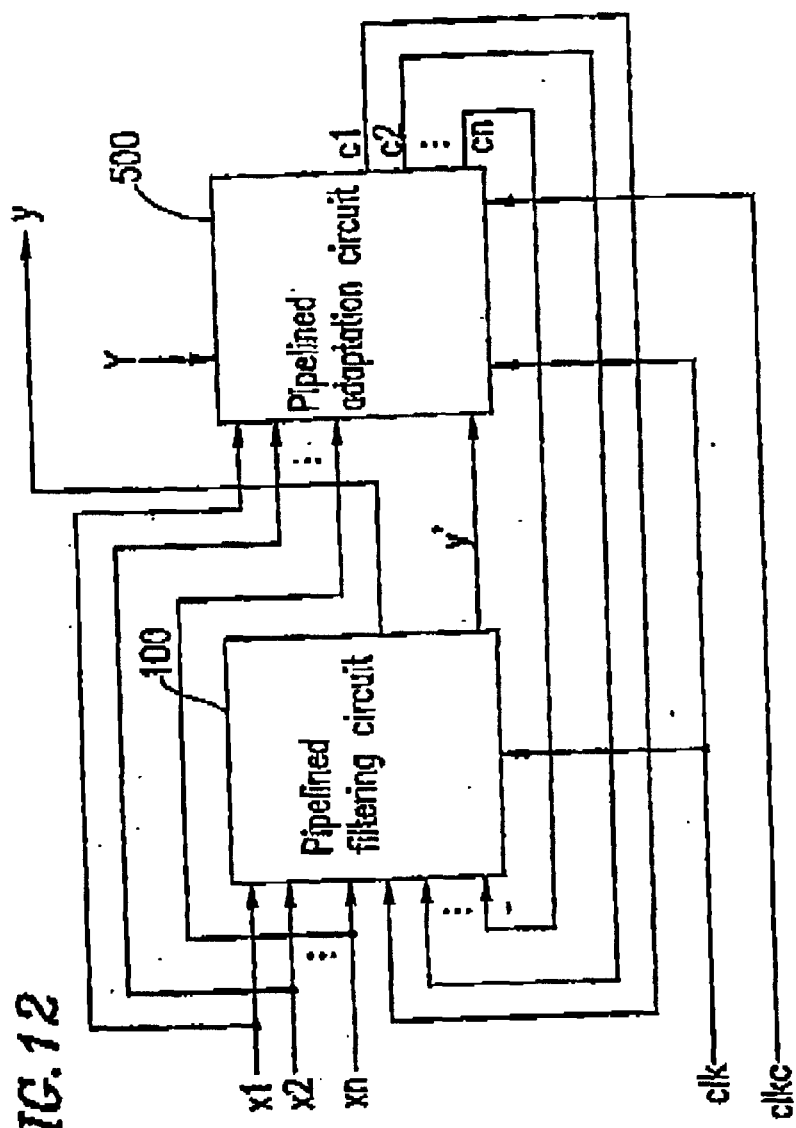
FIG. 12 illustrates a configuration of a conventional adaptive digital filter circuit.

FIG. 11 illustrates an exemnplary read/write channel LSI 900 of ahard disk drive using the PR equalizer 800.

By using the adaptive digital fillter of Embodiment 1 which has a low power consumption and in which the coefficient converges in a reduced amount of time, it is possible to realize a PR equalizer which has a low power consumption and in which the coefficient converges in a reduced amount of time.

It is possible to use the non-pipelined adaptation circuit 110' (FIG. 6) of Embodiment 2 in place of the on-pipelined adaptation circuit 110 of the PR qualizer 800. In such a case, it is possible to obtain the ffects of Embodiment 2, i.e., the reduction in the amount of time required for the coefficient adaptation operation. Alternatively, it is possible to reduce the amount of time required for the coefficient data ci to converge by using a more complicated variation of values of the convergence coefficient $\mu$ to be used in Expression 3.

According to the present invention, the number of registers required for the adaptation circuit is reduced because the coefficient adaptation operation of the adaptation circuit is not performed in a pipelined process. Therefore, it is possible to provide an adaptive digital filter with a reduced power consumption.

By the reduction in the number of registers, it is possible to reduce the delay occurring due to the setup and hold time of the registers and to perform the coefficient adaptation operation in a reduced amount of time.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An adaptive digital filter, comprising:
    a pipelined filtering section for perfornming a filtering operation in a pipelined process based on input data and coefficient data so as to output filtered data;
    a non-pipelined adaptation section for outputting the coefficient data to the pipelined filtering section by performing a coefficient adaptation operation in a non-pipelined process based on the input data and the filtered data so that the filtered data output from the pipelined filtering section converges to a predetermined reference value; and
    a secondary clock signal generation circuit for receiving the primary clock signal, generating the at least one secondary clock signal so as to be synchronized with the primary clock signal, and outputting the at least one secondary clock signal to the non-pipelined adaptation section,
    wherein the pipelined filtering section operates according to a primary clock signal having a predetermined frequency;
    the non-pipelined adaptation section operates based on at least one secondary clock signal which is synchronized with the primary clock signal and has a frequency which is different from the predetermined frequency;
    the at least one secondary clock signal includes a first secondary clock signal for latching the input data; and
    wherein the at least one secondary clock signal further includes:
        a second secondary clock signal for latching the filtered data; and
        a third secondary clock signal for latching a result of the coefficient adaptation operation.

2. An adaptive digital filter according to claim 1, wherein:
    the pipelined process has a predetermined number of stages;
    a relationship between a phase of the first secondary clock signal and a phase of the second secondary clock signal is dependent on the number of stages; and
    a relationship between the phase of the second secondary clock signal and a phase of the third secondary clock signal is dependent on an amount of time required for the coefficient adaptation operation.

3. An adaptive digital filter according to claim 1, wherein at least a part of the coefficient adaptation operation is performed during a period of time from a point in time when the input data is latched in response to the first secondary clock signal to a point in time when the filtered data is latched in response to the second secondary clock signal.

4. An adaptive digital filter according to claim 1, wherein a phase and a cycle of the first secondary clock signal, a phase and a cycle of the second secondary clock signal, and a phase and a cycle of the third secondary clock signal can be set by a software program.

5. An adaptive digital filter according to claim 1, wherein the coefficient adaptation operation is implemented by a software program, and the software program executes an operation of waiting for an input of a pulse of the first secondary clock signal.

6. An adaptive digital filter according to claim 1, wherein the coefficient adaptation operation is implemented by a software program, and the software program executed an operation of waiting for an input of a pulse of the second secondary clock signal.

7. An adaptive digital filter, comprising:
    a pipelined filtering section for performing a filtering operation in a pipelined process based on input data and coefficient data so as to output filtered data; and
    a non-pipelined adaptation section for outputting the coefficient data to the pipelined filtering section by performig a coefficient adaptation operation in a non-pipelined process based on the input data and the filtered data so that the filtered data output from the pipelined filtering section converges to a predetermined reference value, wherein the pipelined filtering section operates according to a primary clock signal having a predetermined frequency;

the non-pipelined adaptation section operates based on at least one secondary clock signal which is synchronized with the primary clock signal and has a frequency which is different from the predetermined frequency;

the at least one secondary clock signal includes a first secondary clock signal for latching the input data;

the non-pipelined adaptation section includes:

an error calculation section for calculating and outputting an error between the filtered data and the predetemined reface value;

a latency compensation section for outputting delayed data obtained by delaying the input data by at least an amount of time which is determined based on the number of stages; and an adaptation operation section for performing the coefficient adaptation operation based on the delayed data and the error so as to output the coefficient data; and the adaptive digital filter further includes a secondary clock signal generation circuit for receiving the primary clock signal generating the first secondary clock signal so as to be synchronized with the primary clock signal, and outputting the first secondary clock signal to the non-pipelined adaptation section; and the latency compensation section includes a register for latching the input data in response to the first secondary clock sigal.

* * * * *